US012615870B2

(12) United States Patent
Cheng et al.

(10) Patent No.: US 12,615,870 B2
(45) Date of Patent: Apr. 28, 2026

(54) METHOD OF FORMING METAL OXIDE SEMICONDUCTOR PHOTODIODE ISOLATION STRUCTURES

(71) Applicant: Taiwan Semiconductor Manufacturing Company, Ltd., Hsinchu (TW)

(72) Inventors: Chung-Liang Cheng, Changhua City (TW); Sheng-Chau Chen, Tainan City (TW); Chung-Yi Yu, Hsin-Chu (TW); Cheng-Yuan Tsai, Chu-Pei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 720 days.

(21) Appl. No.: 17/870,354

(22) Filed: Jul. 21, 2022

(65) Prior Publication Data

US 2024/0030259 A1     Jan. 25, 2024

(51) Int. Cl.
H10F 39/00          (2025.01)
(52) U.S. Cl.
CPC ......... H10F 39/807 (2025.01); H10F 39/011 (2025.01)

(58) Field of Classification Search
CPC ..... H10F 39/807; H10F 39/011; H10F 39/014
See application file for complete search history.

(56) References Cited

U.S. PATENT DOCUMENTS

| | | | |
|---|---|---|---|
| 2017/0062496 A1* | 3/2017 | Lai ..................... | H10F 39/8053 |
| 2019/0096929 A1* | 3/2019 | Chiang ................ | H10F 39/199 |
| 2019/0157322 A1* | 5/2019 | Li ....................... | H01L 21/763 |
| 2020/0111821 A1* | 4/2020 | Hong ................... | H10F 39/024 |
| 2021/0183922 A1* | 6/2021 | Chou ................... | G01J 1/44 |
| 2021/0193704 A1* | 6/2021 | Sun ..................... | H10F 39/8037 |
| 2021/0335861 A1* | 10/2021 | Cheng .................. | H10F 39/809 |

* cited by examiner

*Primary Examiner* — William B Partridge
*Assistant Examiner* — Chevy J Boegel
(74) *Attorney, Agent, or Firm* — Harrity & Harrity, LLP

(57) ABSTRACT

Doping a liner of a trench isolation structure with zinc and/or gallium reduces dark current from a photodiode. For example, the zinc and/or gallium may be deposited on a temporary oxide layer and driven into a high-k layer surrounding a deep trench isolation structure and an interface between the high-k layer and surrounding silicon. In another example, the zinc and/or gallium may be deposited on an oxide layer between the high-k layer and surrounding silicon. As a result, sensitivity of the photodiode is increased. Additionally, breakdown voltage of the photodiode is increased, and a quantity of white pixels in a pixel array including the photodiode are reduced.

20 Claims, 35 Drawing Sheets

300a

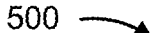
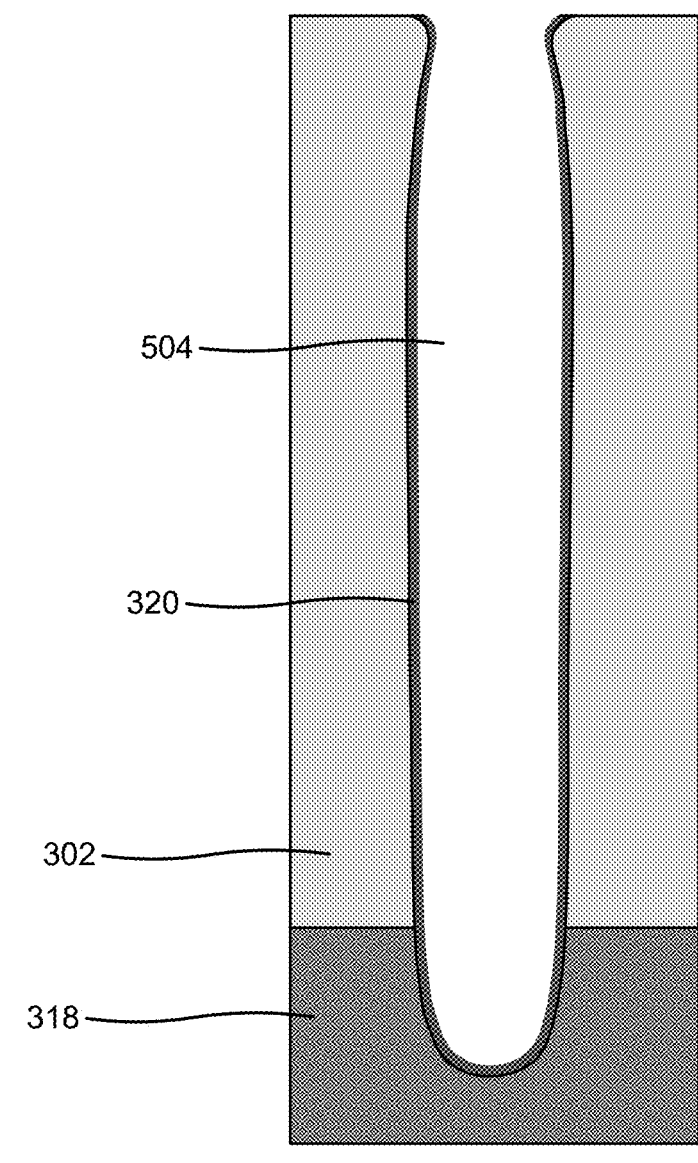
FIG. 5N

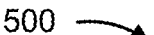
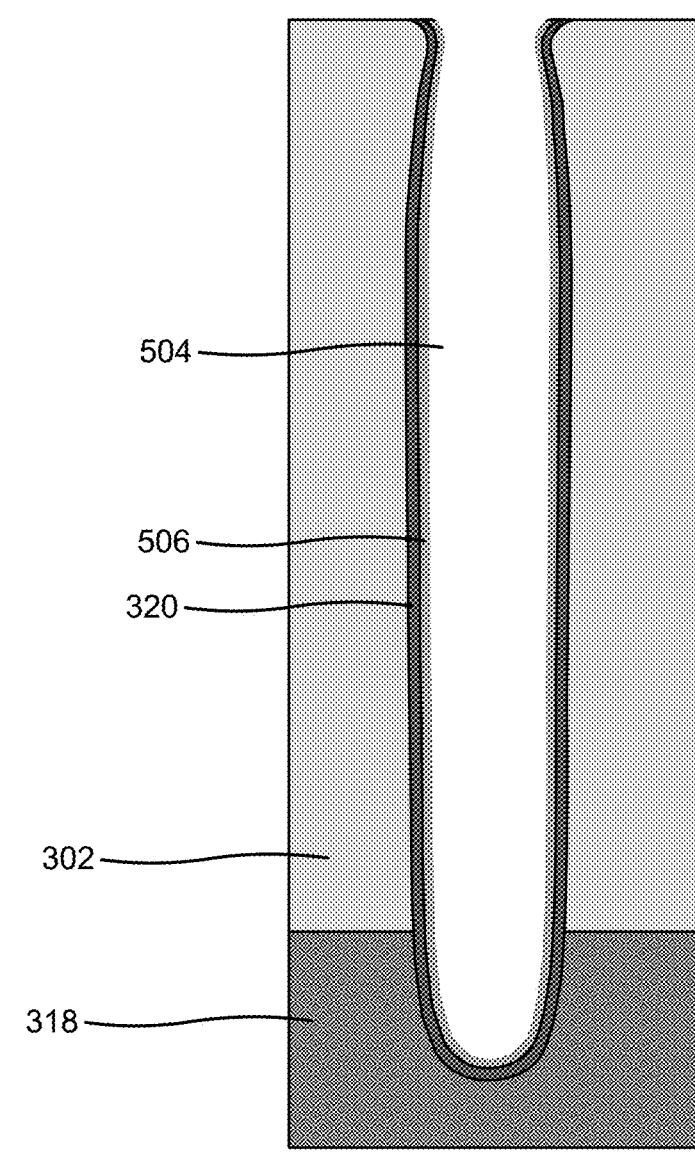
FIG. 5O

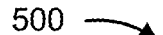
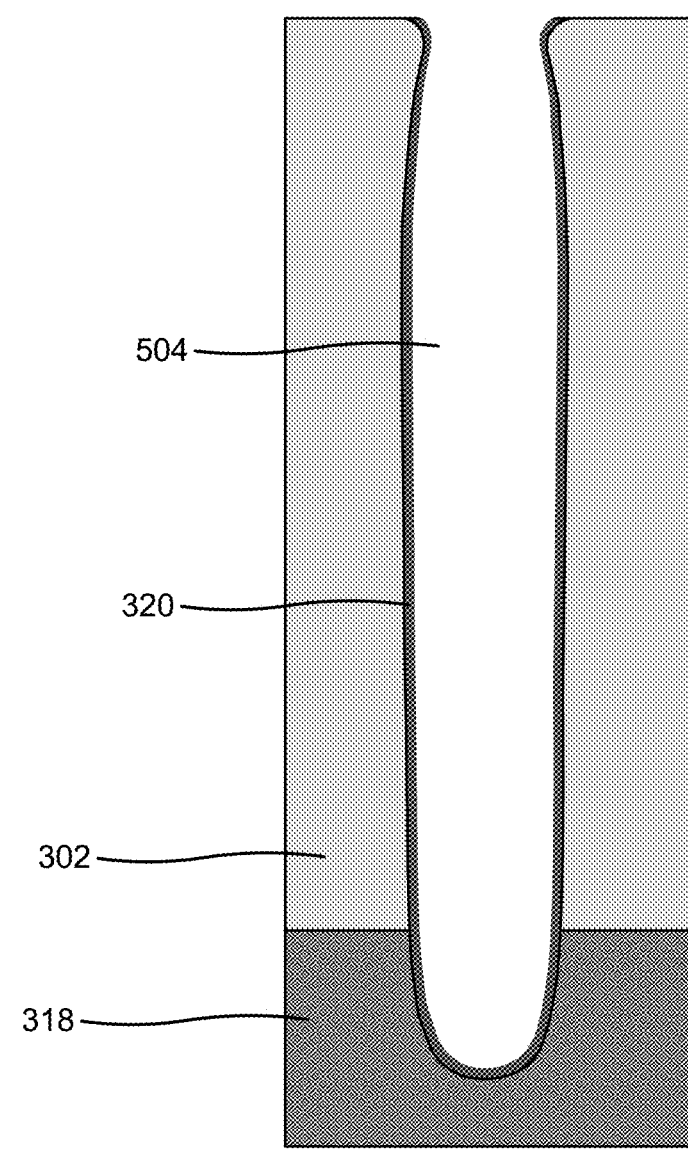
FIG. 5Q

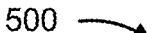
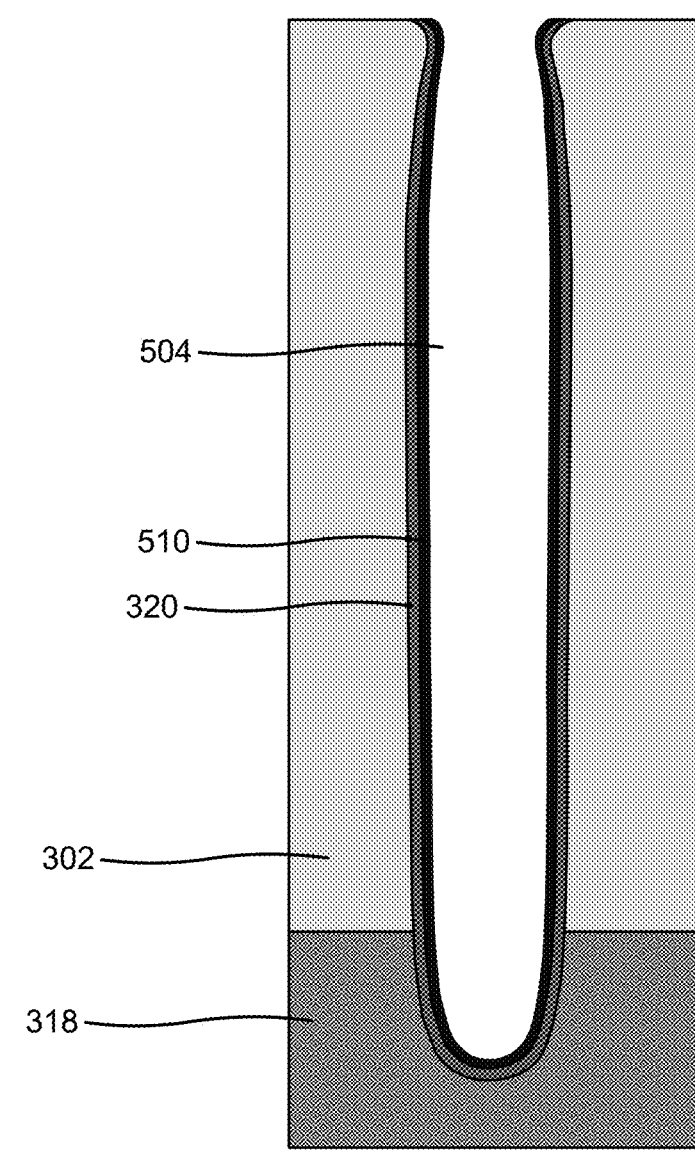
FIG. 5R

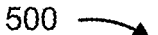
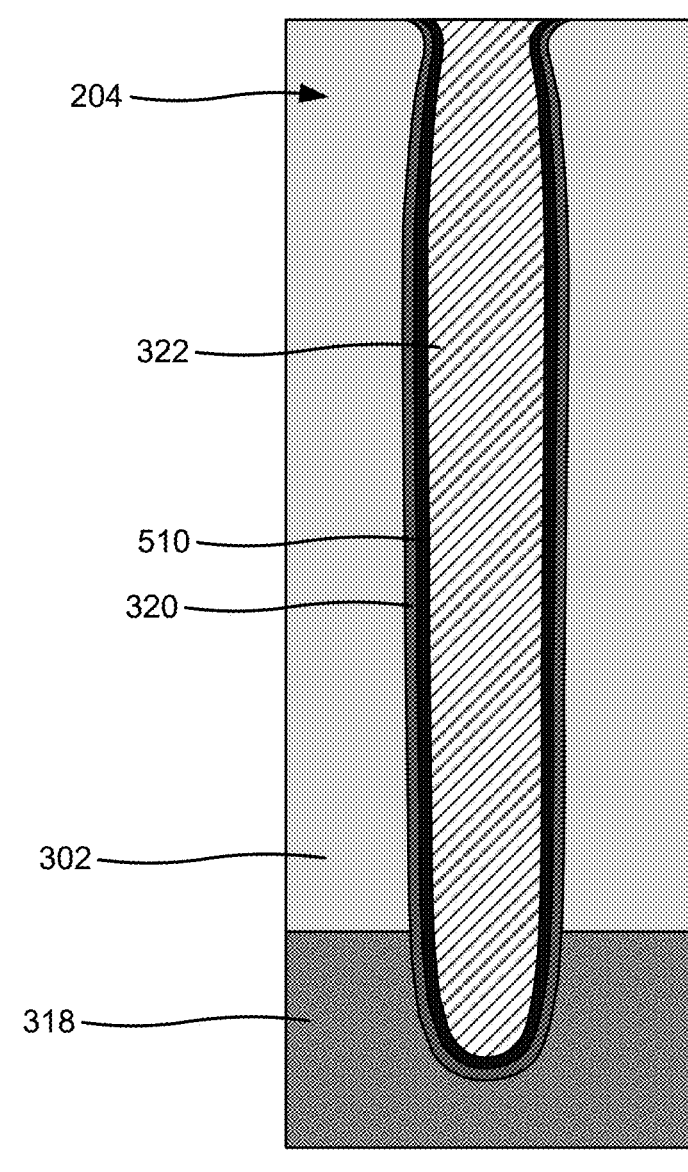
FIG. 5S

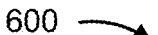
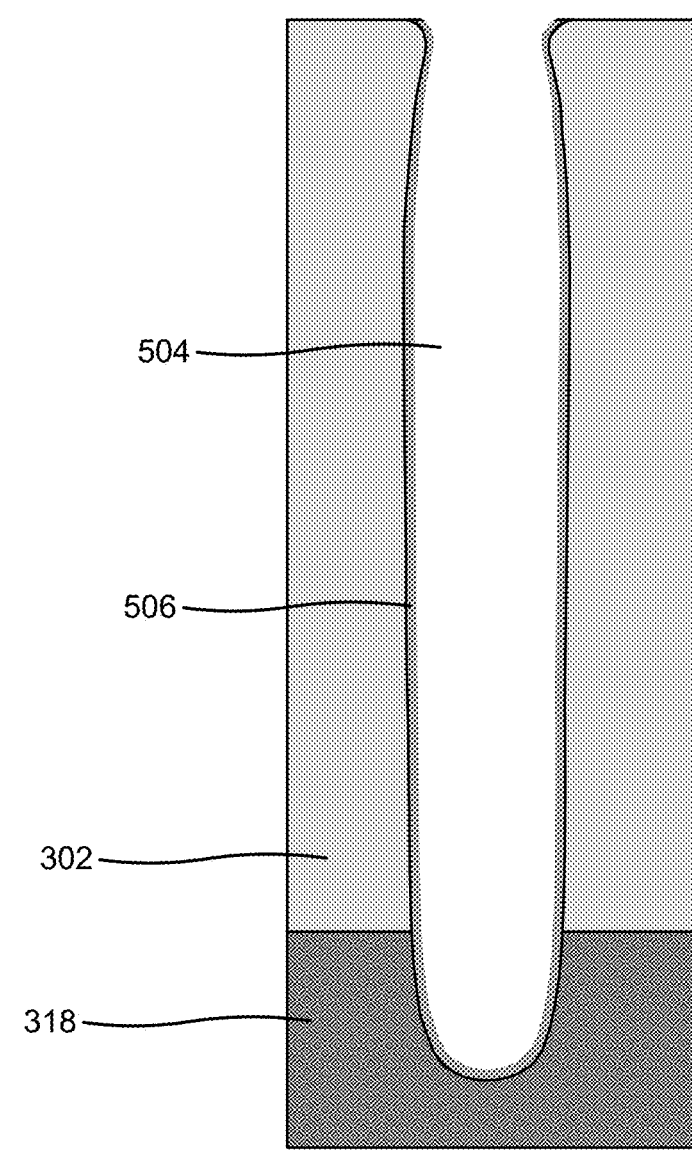
FIG. 6A

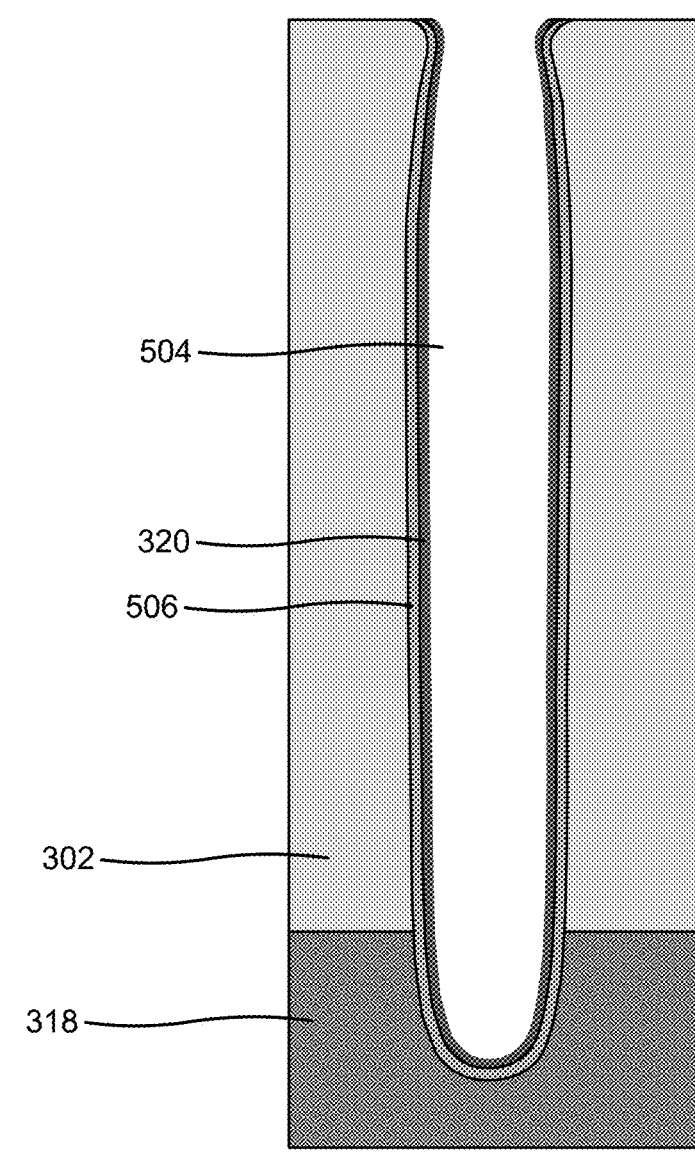
FIG. 6B

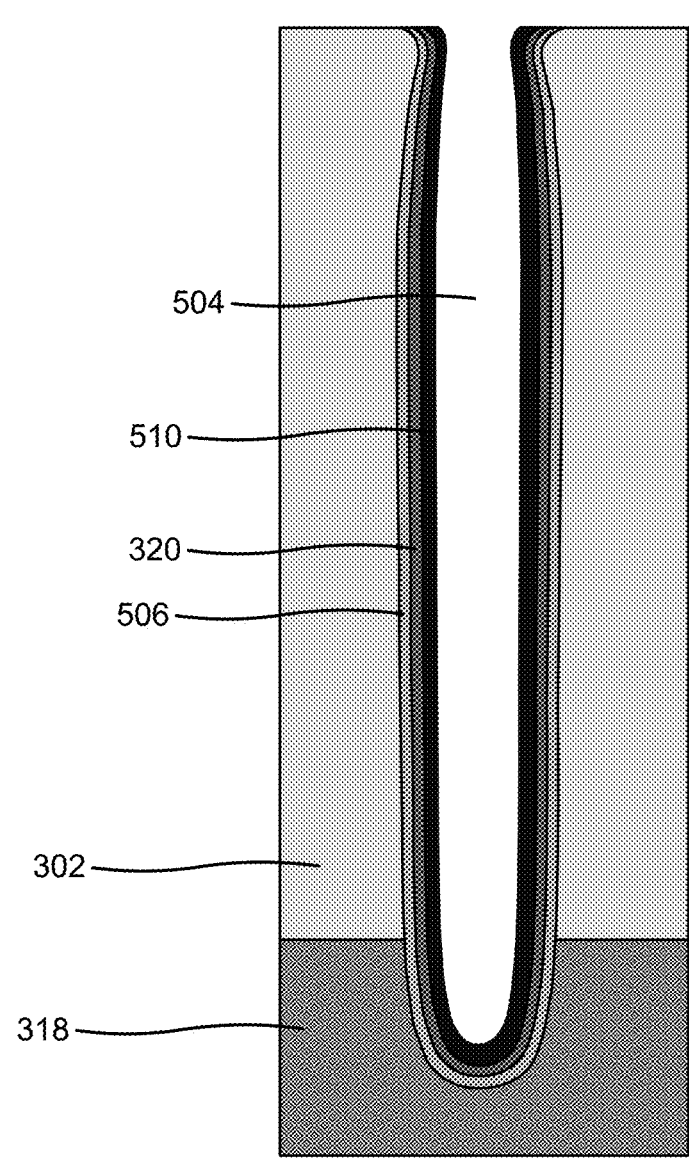
FIG. 6C

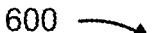
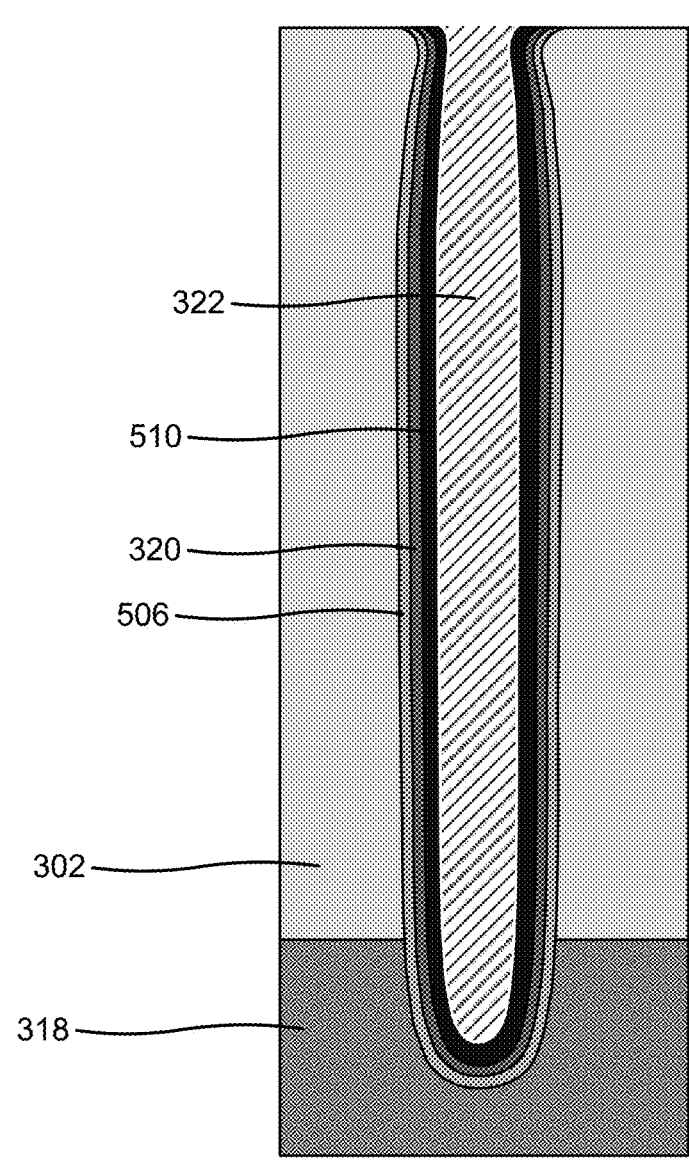
FIG. 6D

716

714

712

710

708

706

704

702

700

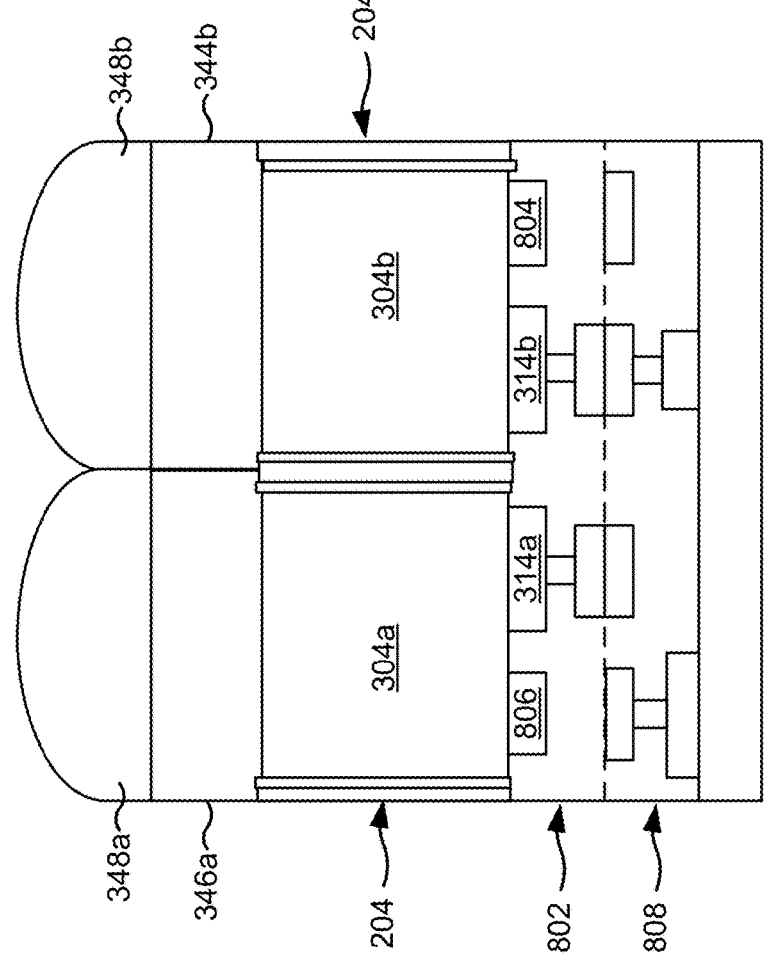
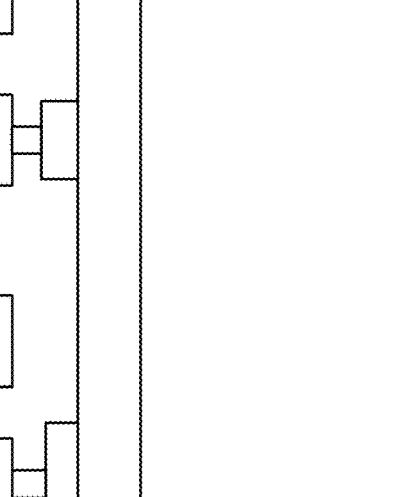
FIG. 8A

1000

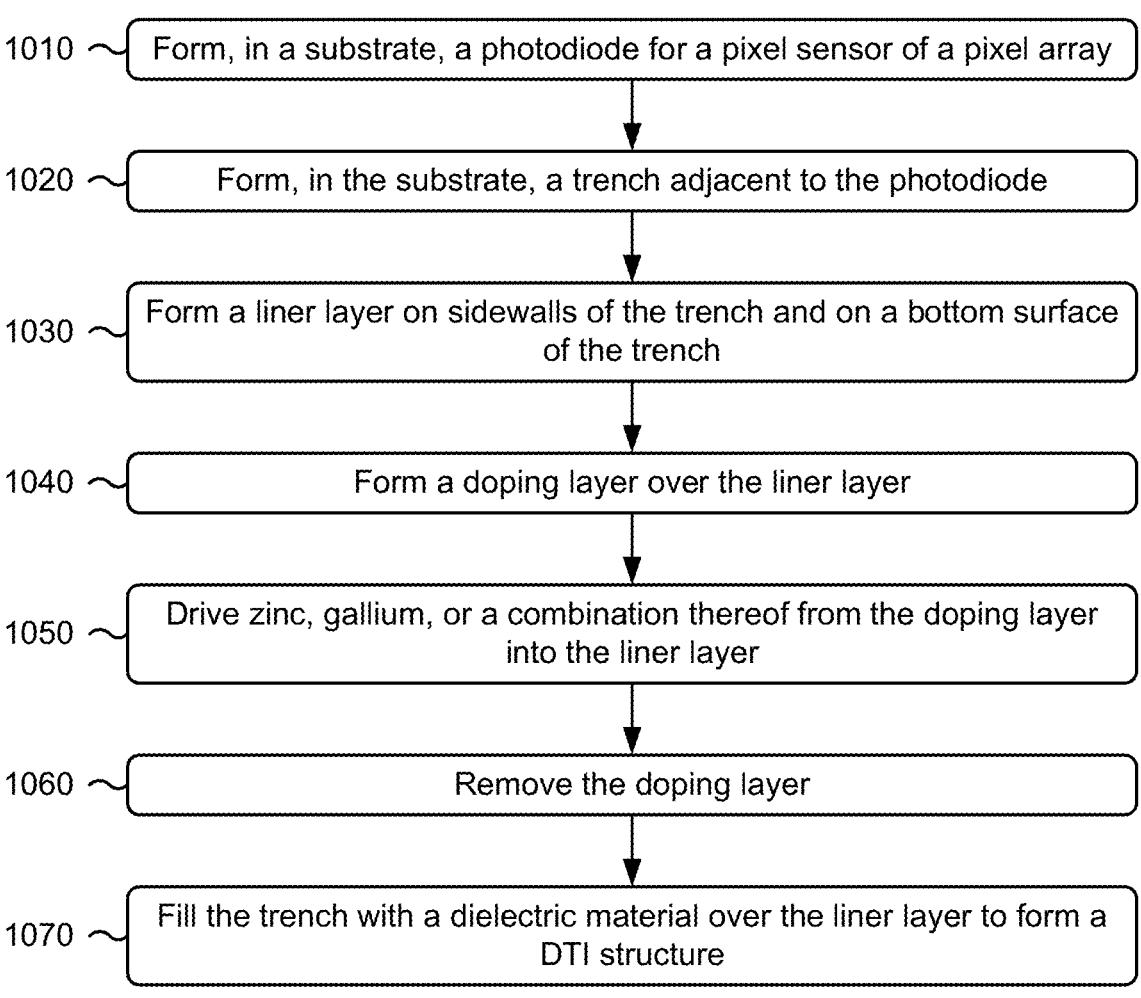

1010 — Form, in a substrate, a photodiode for a pixel sensor of a pixel array

1020 — Form, in the substrate, a trench adjacent to the photodiode

1030 — Form a liner layer on sidewalls of the trench and on a bottom surface of the trench 1040 — Form a doping layer over the liner layer 1050 — Drive zinc, gallium, or a combination thereof from the doping layer into the liner layer 1060 — Remove the doping layer 1070 — Fill the trench with a dielectric material over the liner layer to form a DTI structure

FIG. 10

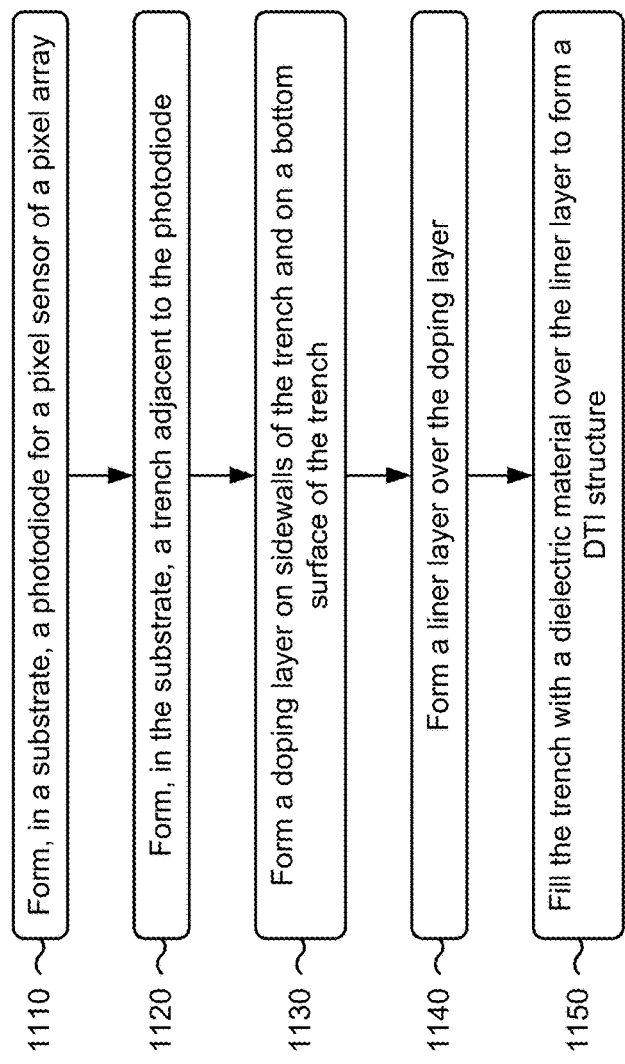
1110  Form, in a substrate, a photodiode for a pixel sensor of a pixel array
1120  Form, in the substrate, a trench adjacent to the photodiode
1130  Form a doping layer on sidewalls of the trench and on a bottom surface of the trench
1140  Form a liner layer over the doping layer
1150  Fill the trench with a dielectric material over the liner layer to form a DTI structure
1100
FIG. 11

METHOD OF FORMING METAL OXIDE SEMICONDUCTOR PHOTODIODE ISOLATION STRUCTURES

BACKGROUND

A complementary metal oxide semiconductor (CMOS) image sensor may include a plurality of pixel sensors. A pixel sensor of the CMOS image sensor may include a transfer transistor, which may include a photodiode config- ured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D are diagrams of an example implementation described herein.

FIGS. 8A and 8B are diagrams of example implementa- tions described herein.

FIGS. 10 and 11 are flowcharts of example processes associated with forming a pixel sensor described herein.

DETAILED DESCRIPTION

Figure 1:
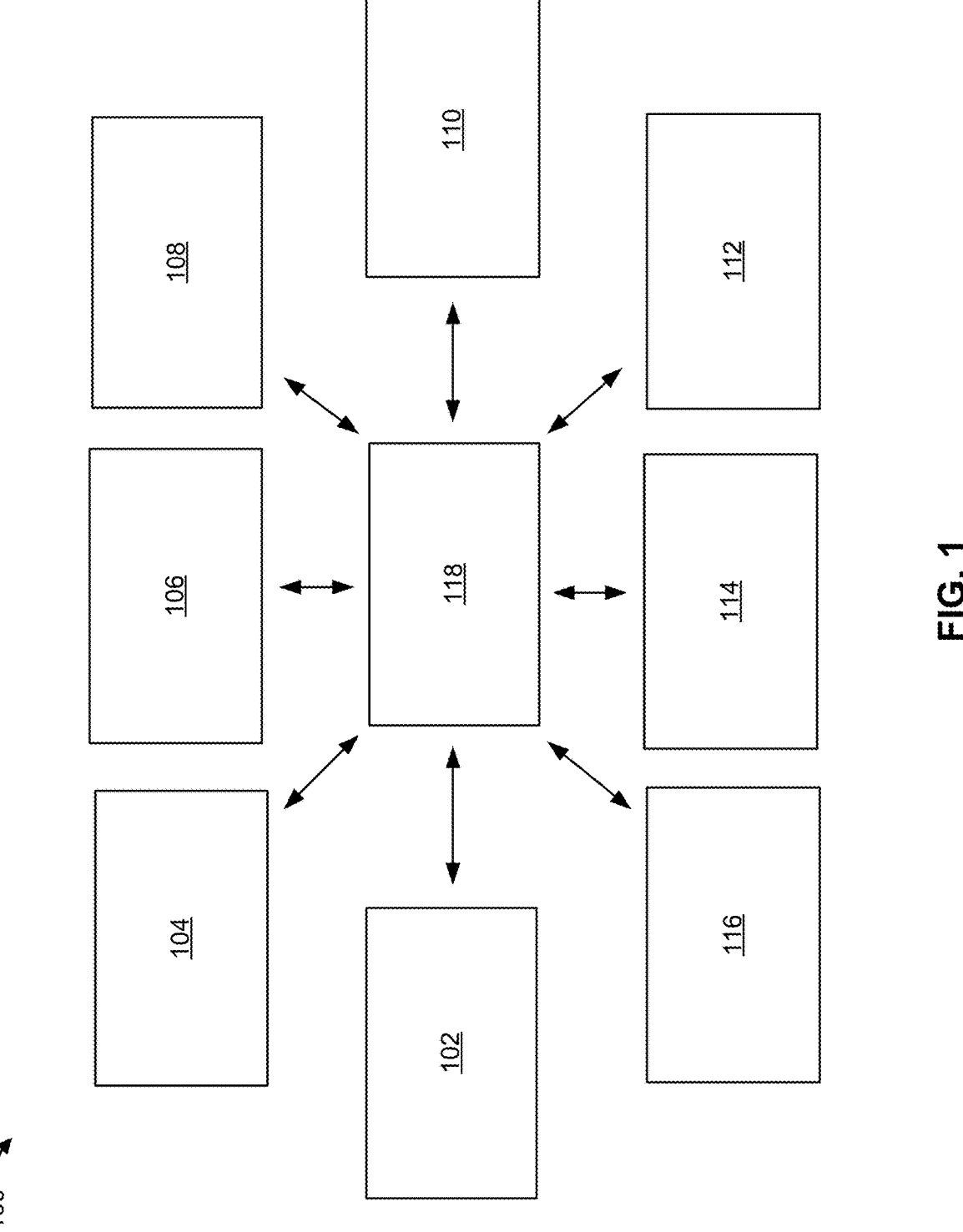
FIG. 1 is a diagram of an example environment in which systems and/or methods described herein may be implemented.

The following disclosure provides many different embodiments, or examples, for implementing different fea- tures of the provided subject matter. Specific examples of components and arrangements are described below to sim- plify the present disclosure. These are, of course, merely examples and are not intended to be limiting. For example, the formation of a first feature over or on a second feature in the description that follows may include embodiments in which the first and second features are formed in direct contact, and may also include embodiments in which addi- tional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accord- ingly.

Photodiodes are often separated by trench isolation struc- tures. For example, a backside deep trench isolation (BDTI) structure and/or a high-k material (also referred to as "HK1") may electrically isolate photodiode regions. How- ever, dark current from the photodiodes into the trench isolation structures still persists and reduces the sensitivity and breakdown voltage of the photodiodes. Dark current may result in white pixels that are defective because the pixels always appear white.

Some implementations described herein provide tech- niques and apparatuses for doping a liner of a trench isolation structure with zinc (Zn) and/or gallium (Ga) such that dark current from a photodiode is reduced. For example, the zinc and/or gallium may be deposited on a temporary oxide layer and driven into the HK1 layer surrounding a BDTI structure and an interface between the HK1 layer and surrounding silicon. In another example, the zinc and/or gallium may be deposited on an oxide layer between the HK1 layer and surrounding silicon. As a result, sensitivity of the photodiode is increased. Additionally, breakdown volt- age of the photodiode is increased, and a quantity of white pixels in a pixel array including the photodiode are reduced.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may in a substrate, a photodiode for a pixel sensor of a pixel array; form, in the substrate, a trench adjacent to the photodiode; form a liner layer on sidewalls of the trench and on a bottom surface of the trench; form a doping layer over the liner layer; drive zinc, gallium, or a combination thereof from the doping layer into the liner layer; remove the doping layer; and fill the trench with a dielectric material over the liner layer to form a deep trench isolation (DTI) structure, among other examples. As another example, one or more of the semi-conductor processing tools 102-116 and/or the wafer/die transport tool 118 may form, in a substrate, a photodiode for a pixel sensor of a pixel array; form, in the substrate, a trench adjacent to the photodiode; form a doping layer on sidewalls of the trench and on a bottom surface of the trench; form a liner layer over the doping layer; and fill the trench with a dielectric material over the liner layer to form a DTI structure, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
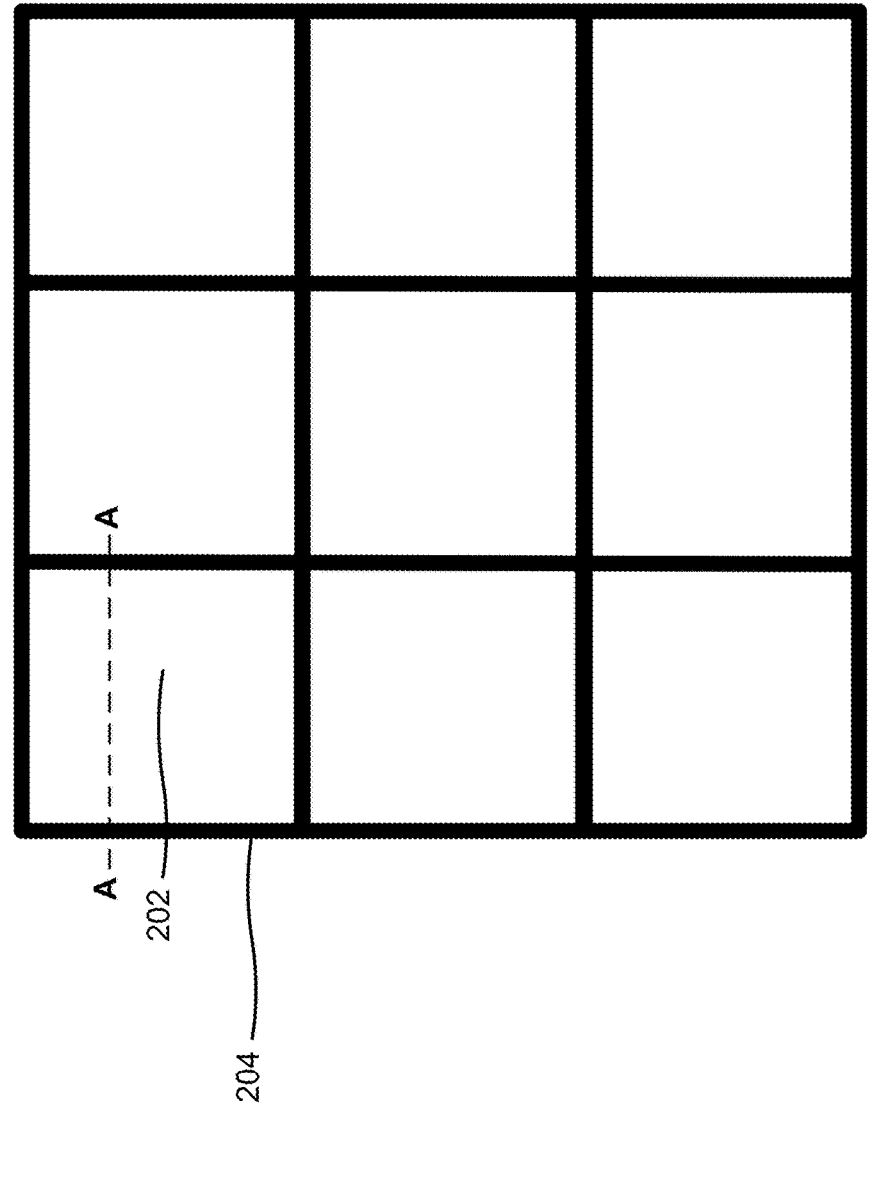
FIG. 2 is a diagram of an example pixel array described herein.

FIG. 2 is a diagram of an example pixel array 200. FIG. 2 illustrates a top-down view of the pixel array 200. In some implementations, the pixel array 200 may be included in an image sensor. The image sensor may include a complementary metal oxide semiconductor (CMOS) image sensor, a backside illuminated (BSI) CMOS image sensor, a front side illuminated (FSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as rectangle shapes, circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

In some implementations, the size of the pixel sensors 202 (e.g., the width or the diameter) of the pixel sensors 202 is approximately 1 micron. In some implementations, the size of the pixel sensors 202 (e.g., the width or the diameter) of the pixel sensors 202 is less than approximately 1 micron. In these examples, the pixel sensors 202 may be referred to as sub-micron pixel sensors. Sub-micron pixel sensors may decrease the pixel sensor pitch (e.g., the distance between adjacent pixel sensors) in the pixel array 200, which may enable increased pixel sensor density in the pixel array 200 (which can increase the performance of the pixel array 200).

The pixel sensors 202 may be electrically and optically isolated by a DTI structure 204 included in the pixel array 200. The DTI structure 204 may include a plurality of interconnected trenches that are filled with a dielectric material such as an oxide. The trenches of the DTI structure 204 may be included around the perimeters of the pixel sensors 202 such that the DTI structure 204 surrounds the pixel sensors 202 (and the photodiodes and drain regions included therein), as shown in FIG. 2. Moreover, the trenches of the DTI structure 204 may extend into a substrate in which the pixel sensors 202 are formed to surround the photodiodes and other structures of the pixel sensors 202 in the substrate. As indicated above, the pixel array 200 may be included in a BSI CMOS image sensor. In these examples, the DTI structure 204 may include a backside DTI (BDTI or BSDTI) structure with a high aspect ratio that is formed from the backside of the pixel array 200.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal. For a BSI CMOS image sensor, the transistor layer may be located between the BEOL metallization stack layers and a lens layer. For a FSI CMOS image sensor, the BEOL metallization stack layers may be located between the transistor layer and the lens layer.

FIG. 2 further illustrates a reference cross-section A-A that is used in one or more figures described herein, such as one or more of FIGS. 3A, 3B, 4, 5A-5M, and 5T. Cross-section A-A is in a plane across a pixel sensor 202 of the pixel array 200. Subsequent figures refer to this reference cross-section for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3A:
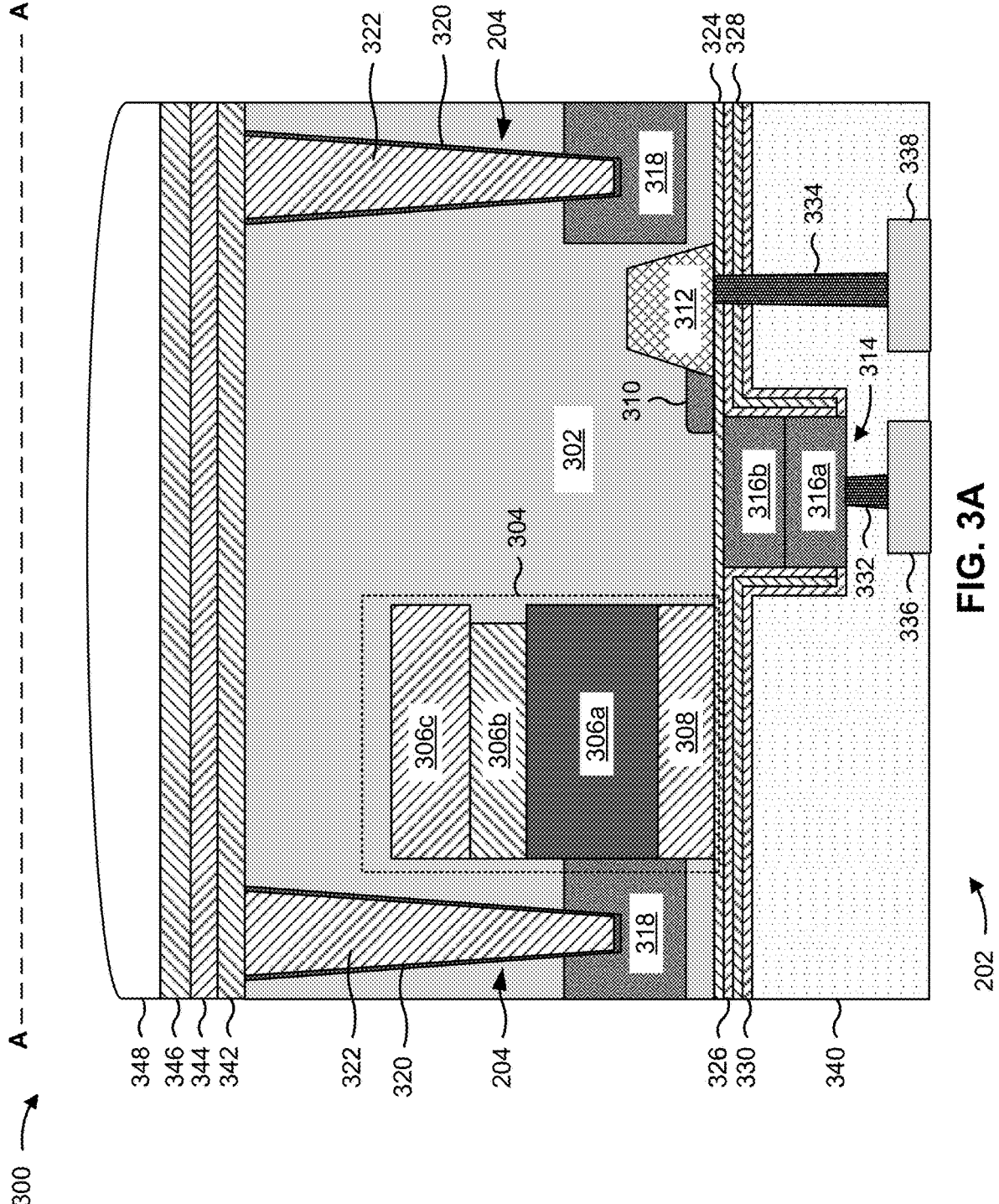
FIGS. 3A-3B are diagrams of examples of a pixel sensor described herein.
Figure 3B:
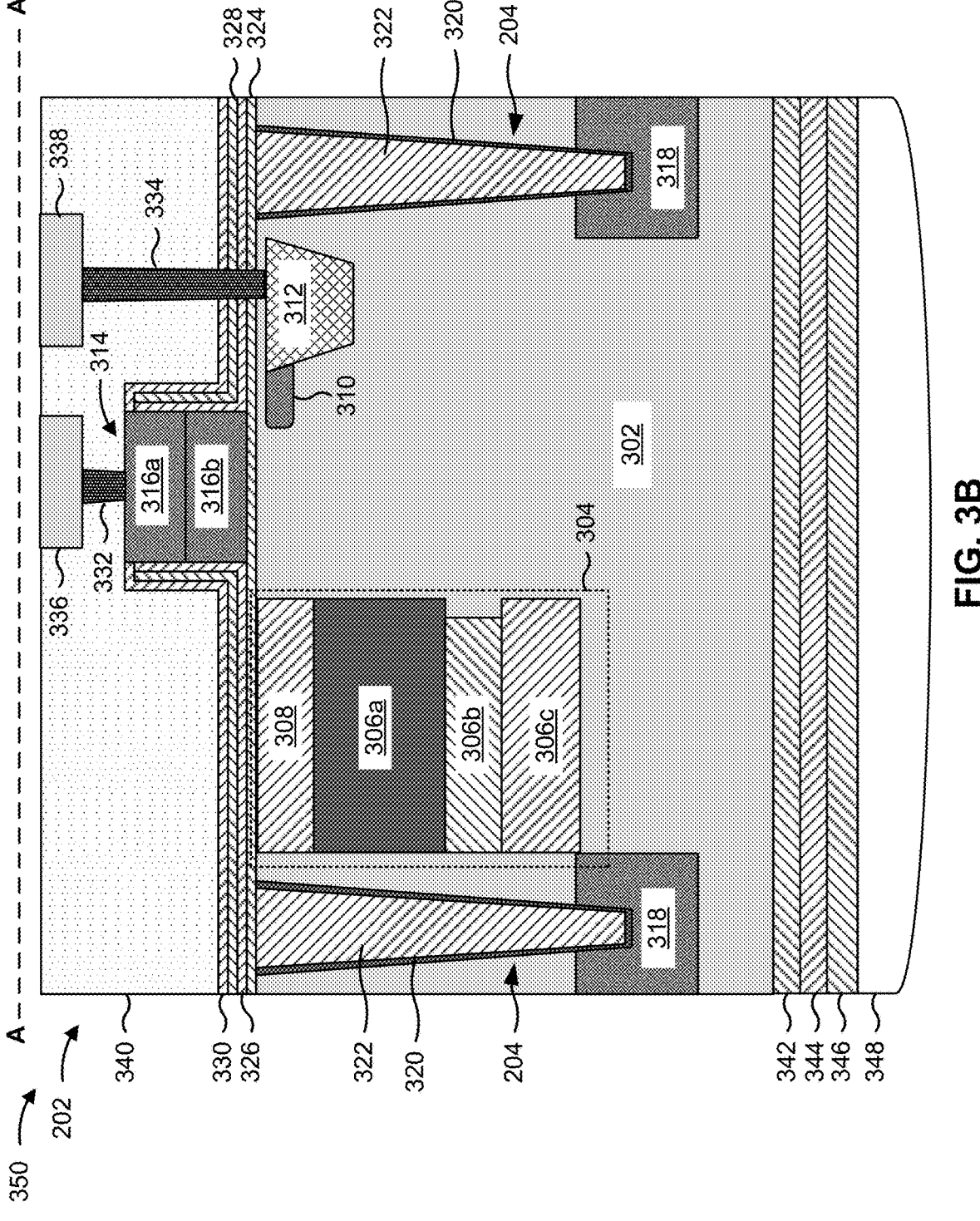

FIGS. 3A and 3B are diagrams of example configurations s of a pixel sensor 202 described herein. In particular, FIGS. 3A and 3B illustrate the example configurations in cross-section views of the pixel sensor 202 along the cross-section A-A of the pixel array 200 in FIG. 2. In some implementations, the pixel sensor 202 may be included in the pixel array 200. In some implementations, the pixel sensor 202 may be included in an image sensor. The image sensor may be a CMOS image sensor, a BSI CMOS image sensor, or another type of image sensor.

FIG. 3A includes an example configuration 300 of a back side DTI CMOS image sensor (BS-DTI-CIS) configuration for a pixel sensor 202. As shown in FIG. 3A, the pixel sensor 202 may include a substrate 302. The substrate 302 may include a semiconductor die substrate, a semiconductor wafer, a stacked semiconductor wafer, or another type of substrate in which semiconductor pixels may be formed. In some implementations, the substrate 302 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 202 may include a photodiode 304 that is included in the substrate 302. The photodiode 304 may include a plurality of regions that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type regions 306 of the photodiode 304, and the substrate 302 may be doped with a p-type dopant to form a p-type region 308 of the photodiode 304. The photodiode 304 may be configured to absorb photons of incident light. The absorption of photons causes the photo-diode 304 to accumulate a charge (referred to as a photo-current) due to the photoelectric effect. Photons may bombard the photodiode 304, which causes emission of electrons in the photodiode 304.

The regions included in the photodiode 304 may be stacked and/or vertically arranged. For example, the p-type region 308 may be included over the one or more n-type regions 306. The p-type region 308 may provide noise isolation for the one or more n-type regions 306 and may facilitate photocurrent generation in the photodiode 304. In some implementations, the p-type region 308 (and thus, the photodiode 304) is spaced away (e.g., downward) from a top surface of the substrate 302 to provide noise isolation and/or light-leakage isolation from one or more upper layers of the pixel sensor 202. The gap between the top surface of the substrate 302 and the p-type region 308 may decrease charging of the pixel sensor 202, may decrease the likelihood of plasma damage to the photodiode 304, and/or may reduce the dark current of the pixel sensor 202 and/or the white pixel performance of the pixel sensor 202, among other examples.

The one or more n-type regions 306 may include an n-type region 306a, an n-type region 306b, and an n-type region 306c. The n-type region 306b may be located over and/or on the n-type region 306c, and the n-type region 306a may be located over and/or on the n-type region 306b. The n-type region 306b and the n-type region 306c may be referred to as deep n-type regions or deep n-wells and may extend the n-type region 306 of the photodiode 304. This may provide an increased area for photon absorption in the photodiode 304. Moreover, at least a subset of the one or more n-type regions 306 may have different doping concentrations. For example, the n-type region 306a may include a greater n-type dopant concentration relative to the n-type region 306b and the n-type region 306c, and the n-type region 306b may include a greater n-type dopant concentration relative to the n-type region 306c. As a result, an n-type dopant gradient is formed, which may increase the migration of electrons upward in the photodiode 304.

The pixel sensor 202 may include a drain extension region 310 and a drain region 312 coupled and/or electrically connected to the drain extension region 310. The drain extension region 310 may be adjacent to the drain region 312. The drain region 312 may include a highly-doped n-type region (e.g., an $n^+$ doped region). The drain extension region 310 may include lightly-doped n-type region(s) that facilitate the transfer of photocurrent from the n-type region 306a to the drain region 312. In some implementations, the drain extension region 310 is spaced away (e.g., downward) from a frontside surface of the substrate 302 to provide noise isolation and/or light-leakage isolation from one or more upper layers of the pixel sensor 202. The gap between the frontside surface of the substrate 302 and the drain extension region 310 may increase noise isolation for the drain extension region 310, may decrease random noise and/or random telegraph noise in the pixel sensor 202, may decrease the likelihood of plasma damage to the drain extension region 310, and/or may reduce the dark current of the pixel sensor 202 and/or the white pixel performance of the pixel sensor 202, among other examples.

The pixel sensor 202 may include a transfer gate 314 to control the transfer of photocurrent between the photodiode 304 and the drain region 312. The transfer gate 314 may be energized (e.g., by applying a voltage or a current to the transfer gate 314) to cause a conductive channel to form between the photodiode 304 and the drain extension region

310. The conductive channel may be removed or closed by de-energizing the transfer gate 314, which blocks and/or prevents the flow of photocurrent between the photodiode 304 and the drain region 312.

The transfer gate 314 may include a gate electrode stack that includes an n-doped upper transfer gate electrode region 316a and a lower transfer gate electrode region 316b. The lower transfer gate electrode region 316b may be included over a portion of the frontside surface of the substrate 302, and the n-doped upper transfer gate electrode region 316a may be located over and/or on the lower transfer gate electrode region 316b. The n-doped upper transfer gate electrode region 318a may include a layer of $n^+$ doped polysilicon. The lower transfer gate electrode region 316b may include a layer of polysilicon.

The pixel sensor 202 may include a plurality of regions to provide electrical isolation and/or optical isolation between the pixel sensor 202 and adjacent pixel sensors. The pixel sensor 202 may include a deep p-well region (DPW) 318 adjacent to, and at least partially surrounding, the photodiode 304. In some implementations, the pixel sensor 202 further includes a cell p-well region (CPW) above the deep p-well region 318. The deep p-well region 318 (and the cell p-well region, if included) may include a circle or ring shape in a top-down view in the substrate 302. The deep p-well region 318 (and the cell p-well region, if included) may each include a $p^+$ doped silicon material or another $p^+$ doped material.

The DTI structure 204 may be included in the substrate 302 adjacent to the photodiode 304 and the drain region 312. Moreover, the DTI structure 204 may be included above and/or partially in the deep p-well region 318. In some implementations, the DTI structure 204 may be included in a cell p-well region. The DTI structure 204 may include one or more trenches that extend downward into the substrate 302 (e.g., from the backside of the substrate 302), and that are that are adjacent the photodiode 304, the drain extension region 310, and the drain region 312. In a top-down view of the pixel sensor 202, the DTI structure 204 may surround the photodiode 304, the drain extension region 310, and the drain region 312. In other words, the photodiode 304, the drain extension region 310, and the drain region 312 may be included within a perimeter of the DTI structure 204 of the pixel sensor 202. The DTI structure 204 may provide optical isolation between the pixel sensor 202 and one or more adjacent pixel sensors to reduce the amount of optical crosstalk between the pixel sensor 202 and the one or more adjacent pixel sensors. In particular, the DTI structure 204 may absorb, refract, and/or reflect photons of incident light, which may reduce the amount of incident light that travels through a pixel sensor 202 into an adjacent pixel sensor and is absorbed by the adjacent pixel sensor.

The DTI structure 204 may include a liner layer 320 between the substrate 302 of the pixel sensor 202 and an oxide layer 322 of the DTI structure 204. The liner layer 320 may include a metal oxide, such as an aluminum oxide (AlO), among other examples. The liner layer 320 may be included between the substrate 302 and the oxide layer 322.

The oxide layer 322 may function to reflect incident light toward the photodiode 304 to increase the quantum efficiency of the pixel sensor 202 and to reduce optical crosstalk between the pixel sensor 202 and one or more adjacent pixel sensors. In some implementations, the oxide layer 322 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 322. The liner layer 320 may be included to increase reflectivity of the DTI structure 204. In some implementations, one or more additional high-κ layers, such as a hafnium oxide (HfO) and/or a tantalum oxide ($Ta_2O_5$), may be included between the oxide layer 322 and the liner layer 320 to further increase reflectivity.

The oxide layer 322 of the DTI structure 204 tends to attract electrons, which results in holes at an interface between the substrate 302 and the liner layer 320. As a result, dark current may be generated at the DTI structure 204 and flow to the transfer gate 314. When a pixel sensor within the pixel array 200 has higher than usual dark current, the pixel sensor may become a white pixel that does not function properly. Additionally, dark current in general reduces breakdown voltage and sensitivity of the pixel sensor 202. Accordingly, as described in connection with FIGS. 4 and 5A-5T, the liner layer 320 may be doped with zinc (Zn) and/or gallium (Ga). Thus, zinc and/or gallium atoms migrate to the interface between the substrate 302 and the liner layer 320 and attract electrons that bond with the holes at the interface. Alternatively, as described in connection with FIGS. 6A-6D, a layer of zinc and/or gallium may be deposited between the liner layer 320 and the substrate 302 to attract electrons that bond with the holes at the interface. As a result, dark current is reduced, which increases breakdown voltage and sensitivity of the pixel sensor 202. Additionally, fewer pixel sensors within the pixel array 200 will be white pixels.

A gate dielectric layer 324 may be included above and/or over the frontside surface of the substrate 302. The lower transfer gate electrode region 316b may be included over and/or on the gate dielectric layer 324. The gate dielectric layer 324 may include a dielectric material such as tetraethyl orthosilicate (TEOS) or another type of dielectric material. A sidewall oxide layer 326 may be included over and/or the gate dielectric layer 324 on the frontside surface of the substrate 302. The sidewall oxide layer 326 may also be included on sidewalls of the n-doped upper transfer gate electrode region 316a and/or on sidewalls of the lower transfer gate electrode region 316b. The sidewall oxide layer 326 may include an oxide such as silicon oxide ($SiO_x$) or another type of oxide material. A remote plasma oxide (RPO) layer 328 may be included over and/or on the sidewall oxide layer 326 over the frontside surface of the substrate 302. The remote plasma oxide layer 328 may also be included over the sidewall oxide layer 326 on the sidewalls of the n-doped upper transfer gate electrode region 316a and/or over the sidewall oxide layer 326 on the sidewalls of the lower transfer gate electrode region 316b. A contact etch stop layer (CESL) 330 may be included over and/or on the remote plasma oxide layer 328 over the frontside surface of the substrate 302. The contact etch stop layer 330 may also be included over the remote plasma oxide layer 328 on the sidewalls of the n-doped upper transfer gate electrode region 316a and/or over remote plasma oxide layer 328 on the sidewalls of the lower transfer gate electrode region 316b.

The transfer gate 314 and the drain region 312 may be electrically connected by interconnects 332 and 334, respectively, with respective metallization layers 336 and 338 above the substrate 302. The interconnects 332 and 334, and the metallization layers 336 and 338, may be included in one or more dielectric layers 340. The interconnect 332 may be electrically connected with the transfer gate 314 by the n-doped upper transfer gate electrode region 316a. In some implementations, the dielectric layer(s) 340 surround and/or encapsulate the interconnects 332 and 334, as well as the metallization layers 336 and 338. The dielectric layer(s) 340 may include an inter-metal dielectric (IMD) layer formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material. The interconnects 332 and 334, as well as the metallization layers 336 and 338, may include one or more conductive materials, such as tungsten (W), cobalt (Co), ruthenium (Ru), copper (Cu), and/or another type of conductive material.

As further shown in FIG. 3A, the pixel sensor 202 may include one or more layers on the back side or a bottom side of the substrate 302. On the substrate 302 (e.g., on the bottom of the substrate 302), a $p^+$ ion layer 342 may be included to increase photon-electron conversion. An antireflective coating (ARC) layer 344 may be included above and/or on the $p^+$ ion layer 342. The ARC 344 may include a suitable material for reducing a reflection of incident light projected toward the photodiode 304. For example, the ARC 344 may include nitrogen-containing material.

A color filter layer 346 may be included above and/or on the ARC 344. In some implementations, the color filter layer 346 includes a visible light color filter configured to filter a particular wavelength or a particular wavelength range of visible light (e.g., red light, blue light, or green light). In some implementations, the color filter layer 346 includes a near infrared (NIR) filter (e.g., an MR bandpass filter) configured to permit wavelengths associated with MR light to pass through the color filter layer 346 and to block other wavelengths of light. In some implementations, the color filter layer 346 includes an MR cut filter configured to block MR light from passing through the color filter layer 346. In some implementations, the color filter layer 346 is omitted from the pixel sensor 202 to permit all wavelengths of light to pass through to the photodiode 304. In these examples, the pixel sensor 202 may be configured as a white pixel sensor.

A micro-lens layer 348 may be included above and/or on the color filter layer 346. The micro-lens layer 348 may include a micro-lens for the pixel sensor 202 configured to focus incident light toward the photodiode 304 and/or to reduce optical crosstalk between the pixel sensor 202 and one or more adjacent pixel sensors.

In operation of the pixel sensor 202, a photocurrent generated by photons of incident light absorbed in the photodiode 304 may originate in the one or more n-type regions 306a-306c. A current (or voltage) may be applied to the transfer gate 314 from the metallization layer 336 through an interconnect 332, the n-doped upper transfer gate electrode region 316a, and the lower transfer gate electrode region 316b. The current (or voltage) may energize the transfer gate 314, which causes an electric field to form a conductive channel in the substrate 302 between the n-type region 306a and the drain extension region 310. The photocurrent may traverse along the conductive channel from the n-type region 306a to the drain extension region 310. The photocurrent may traverse from the drain extension region 310 to the drain region 312. The photocurrent may be measured through the interconnect 334 at the metallization layer 338.

FIG. 3B includes an example configuration 350 of a front side DTI CMOS image sensor (FS-DTI-CIS) configuration for a pixel sensor 202. In the example configuration 350, the DTI structure 204 is formed in the substrate 302 from a front side or top side of the substrate 302. In the example configuration 350, the p-type region 308 may be included over the one or more n-type regions 306. The n-type region 306b may be included over and/or on the n-type region 306c, the n-type region 306a may be included over and/or on the n-type region 306b. The p-type region 308 may be included over and/or on the n-type region 306a.

As further shown in FIG. 3B, the pixel sensor 202 may include one or more layers on the front side or a bottom side of the substrate 302. On the substrate 302 (e.g., on the top of the substrate 302), a p+ ion layer 342 may be included to increase photon-electron conversion. An antireflective coating (ARC) layer 344 may be included above and/or on the p+ ion layer 342. A color filter layer 346 may be included above and/or on the ARC 344. A micro-lens layer 348 may be included above and/or on the color filter layer 346.

As indicated above, FIGS. 3A and 3B are provided as examples. Other examples may differ from what is described with regard to FIGS. 3A and 3B.

Figure 4:
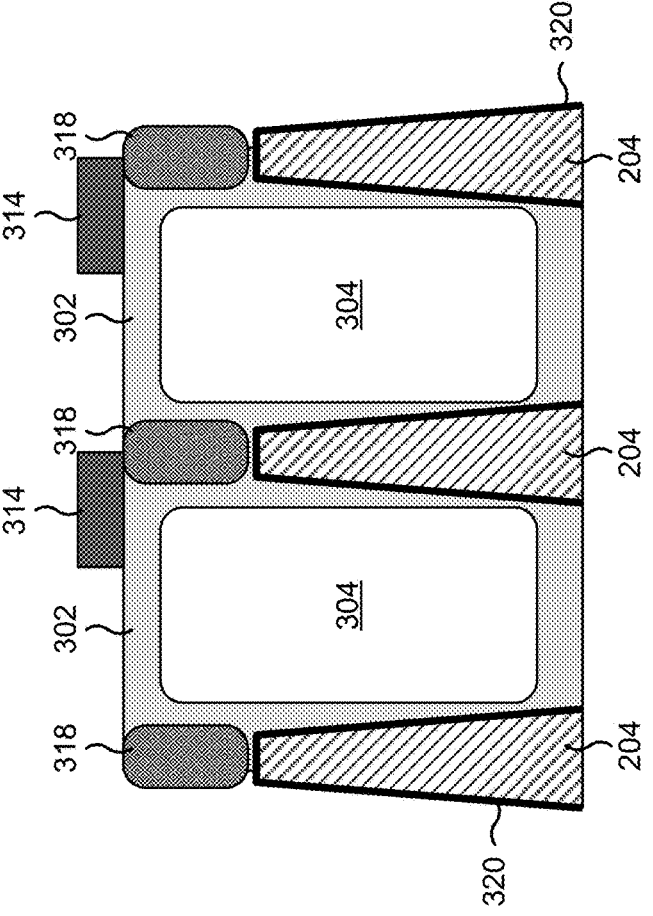
FIG. 4 is a diagram of an example implementation described herein.

FIG. 4 is a diagram of an example of a pixel group 400 described herein. In particular, FIG. 4 illustrates a portion of the pixel array 200 described in connection with FIG. 2. As shown in FIG. 4, the pixel group 400 may include a substrate 302. The substrate 302 may include a semiconductor die substrate, a semiconductor wafer, a stacked semiconductor wafer, or another type of substrate in which semiconductor pixels may be formed.

The pixel group 400 may further include photodiodes 304 that are included in the substrate 302. The pixel group 400 may include a plurality of regions to provide electrical isolation and/or optical isolation between the photodiodes 304. The pixel group 400 may include DPWs 318 adjacent to, and at least partially surrounding, the photodiodes 304. Each DPW 318 may include a circle or ring shape in a top-down view in the substrate 302. The DPWs 318 may each include a p+ doped silicon material or another p+ doped material.

The DTI structures 204 may be included in the substrate 302 adjacent to the photodiodes 304. Moreover, the DTI structures 204 may be included above and/or partially in the DPWs 318. The DTI structures 204 may include one or more trenches that extend downward into the substrate 302 (e.g., from the backside of the substrate 302) and that are adjacent the photodiodes 304. In a top-down view of the pixel group 400, the DTI structures 204 may surround the photodiodes 304. Accordingly, the photodiodes 304 may be included within a perimeter of the DTI structures 204 of the pixel group 400.

The DTI structures 204 may each include a liner layer 320 between the substrate 302 of the pixel group 400 and an oxide layer 322 of the DTI structure. The liner layer 320 may include a metal oxide, such as an aluminum oxide (AlO), among other examples. In some implementations, one or more additional high-κ layers, such as a hafnium oxide (HfO) and/or a tantalum oxide (Ta₂O₅), may be included between the oxide layer 322 and the liner layer 320 to further increase reflectivity of the DTI structure.

As shown in FIG. 4, an interface may be included between the liner layer 320 and the substrate 302. The interface may include an aluminum-silicon interface (or another metal-silicon interface). Accordingly, when the liner layer 320 is doped with zinc (Zn) and/or gallium (Ga), zinc and/or gallium atoms diffuse to the interface and attract electrons that bind with holes at the interface. As a result, dark current is reduced, which increases breakdown voltage and sensitivity of the pixel group 400. Additionally, fewer pixel sensors within the pixel array 200 will be white pixels.

The transfer gates 314 may each include a gate electrode stack. Accordingly, in operation of the pixel group 400, photocurrents generated by photons of incident light absorbed in the photodiodes 304 may originate in one or more n-type regions of the photodiodes 304. The current (or voltage) may energize the transfer gates 314. Accordingly, the photocurrents may traverse from the n-type regions of the photodiodes 304 to a drain region (not shown) for measurement.

As indicated above, FIG. 4 is provided as an example. Other examples may differ from what is described with regard to FIG. 4.

Figure 5A:
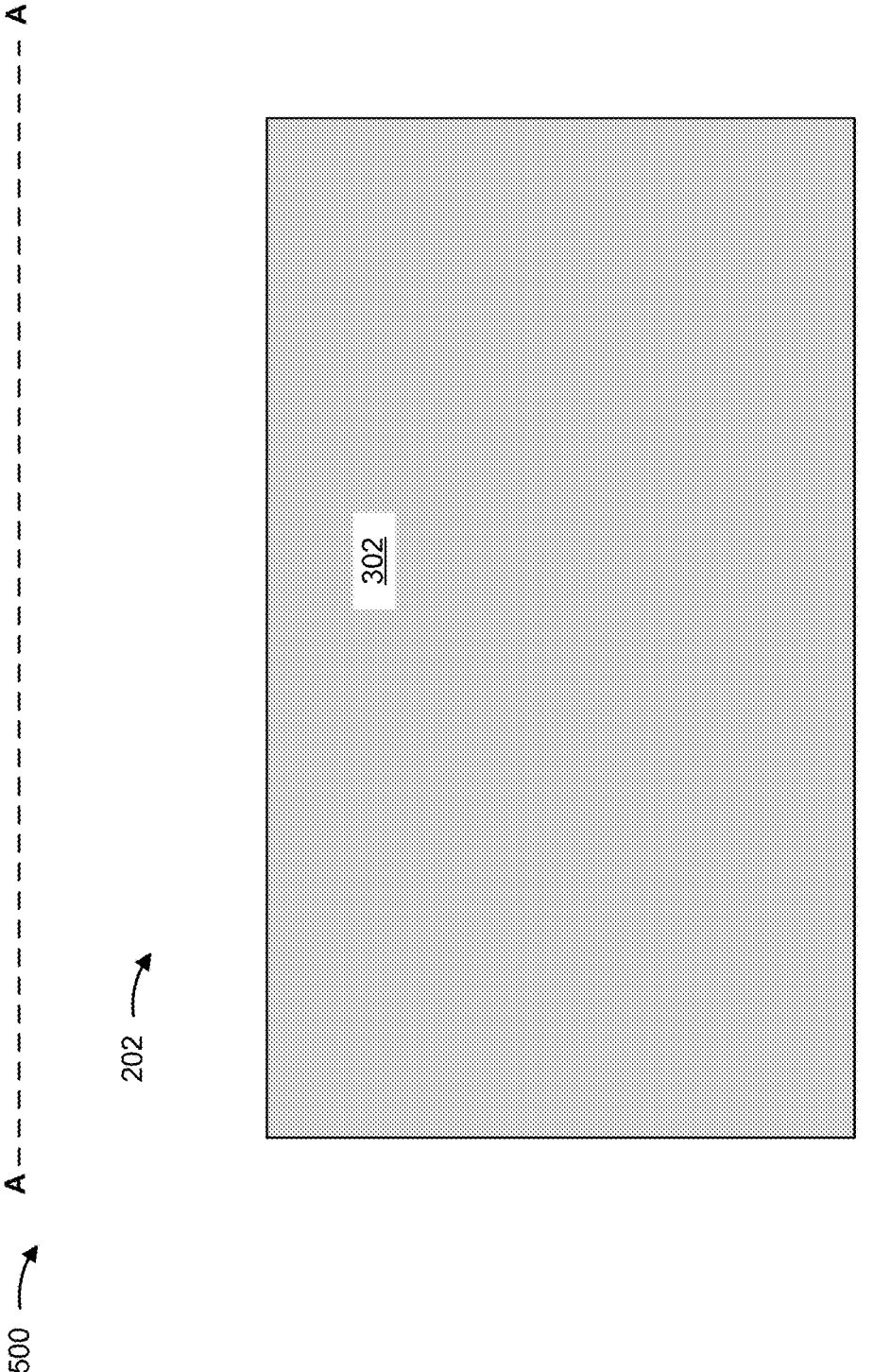
FIGS. 5A-5T are diagrams of an example implementation described herein.
Figure 5B:
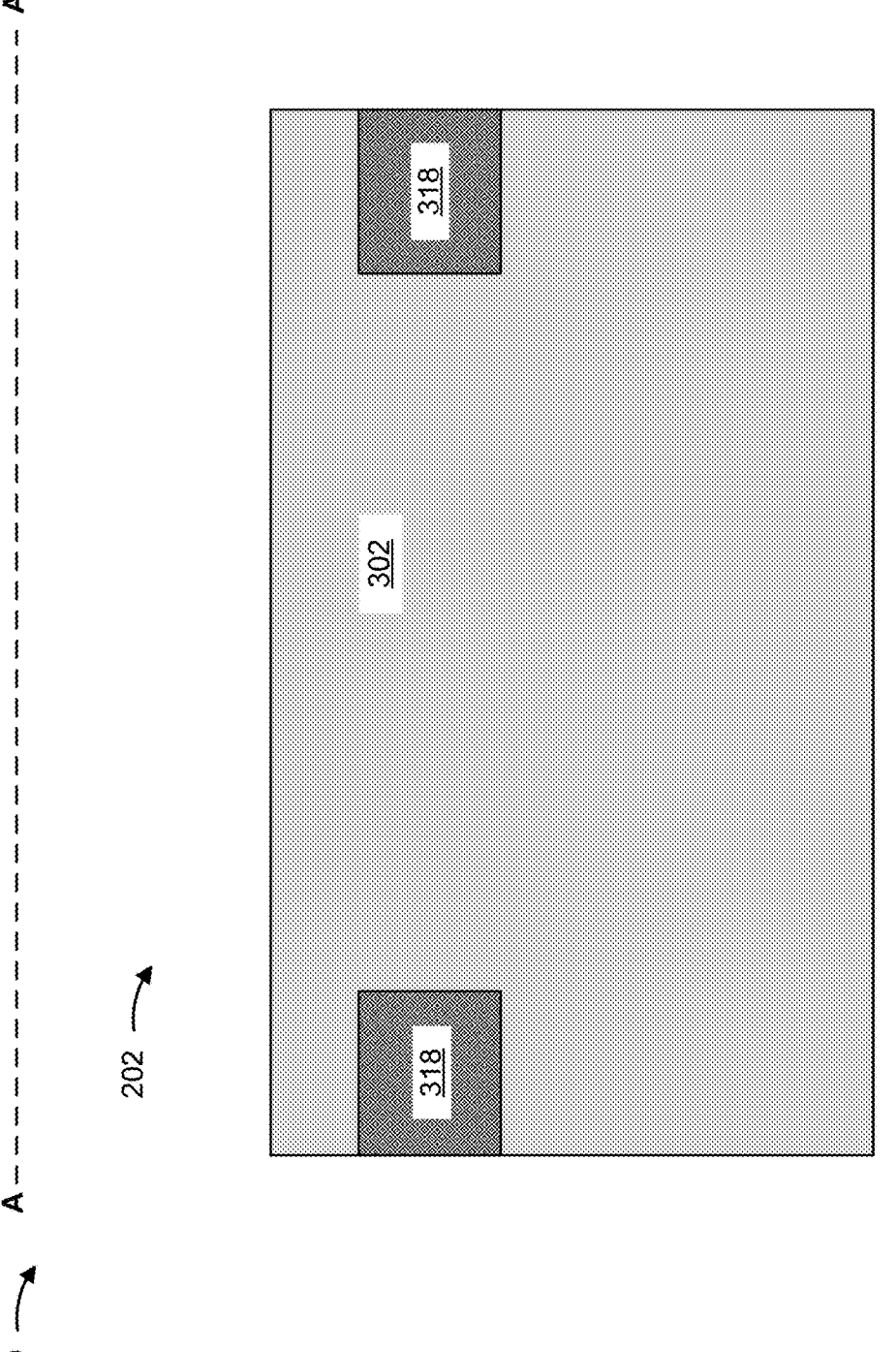
Figure 5C:
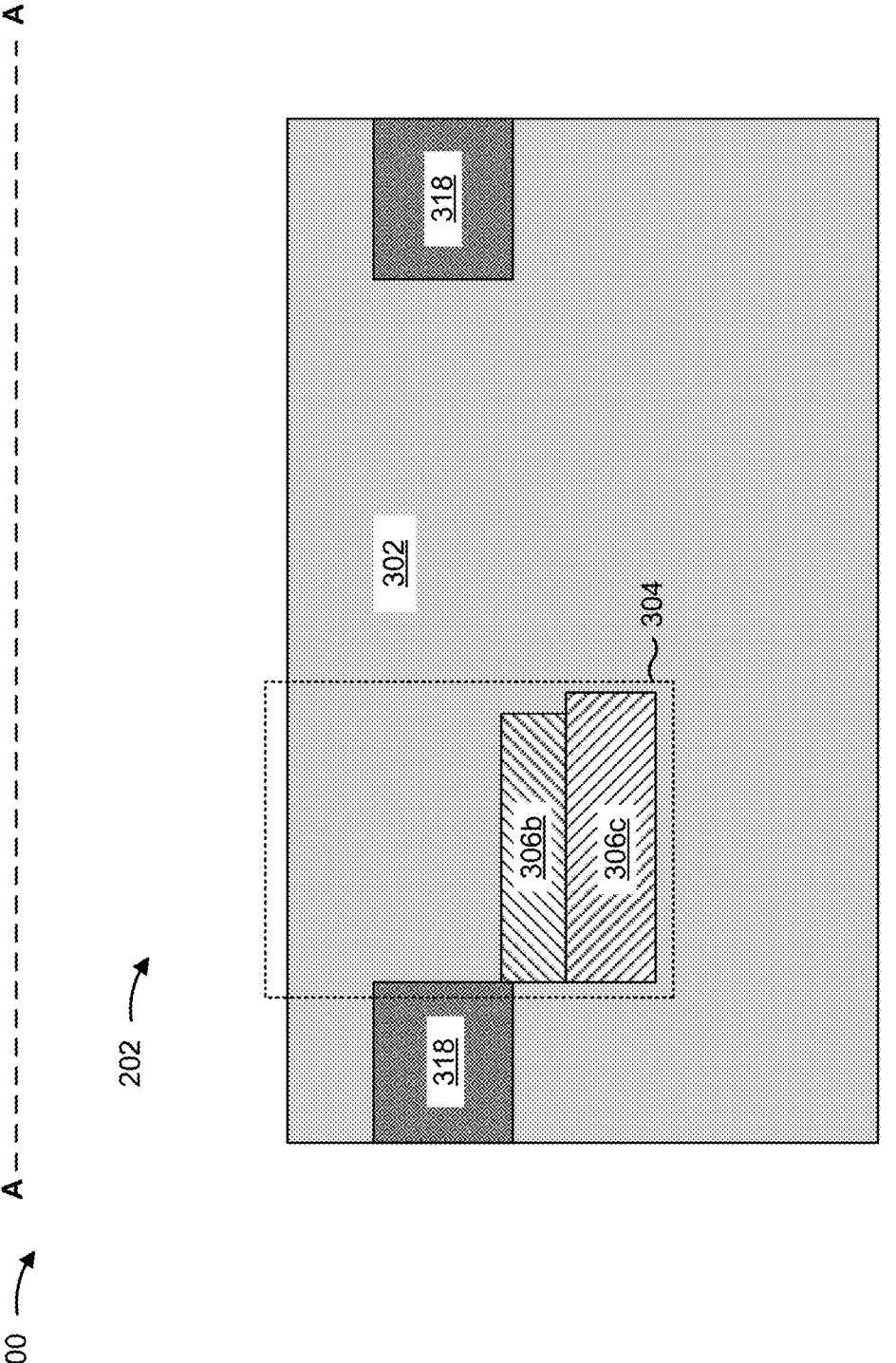
Figure 5D:
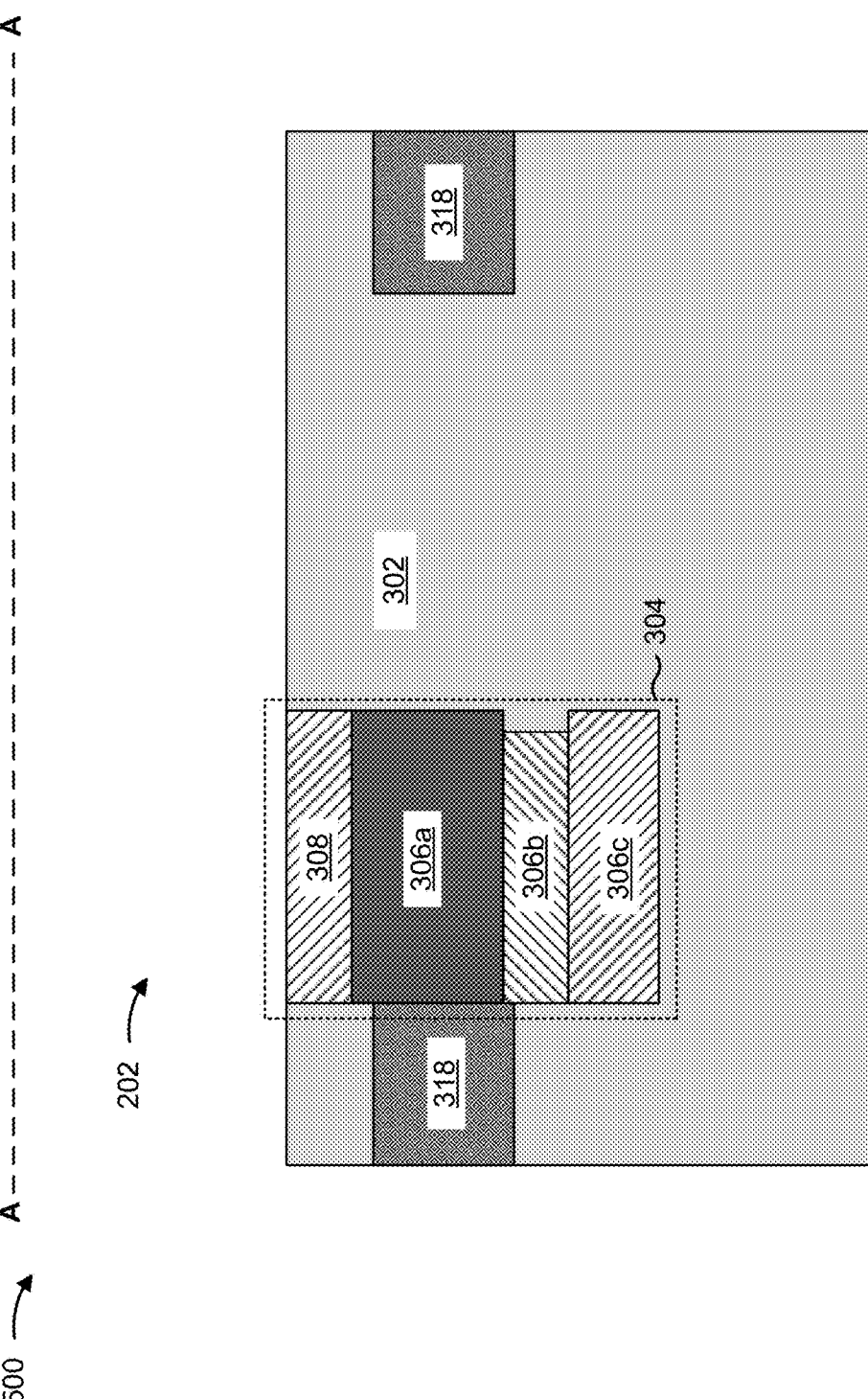
Figure 5E:
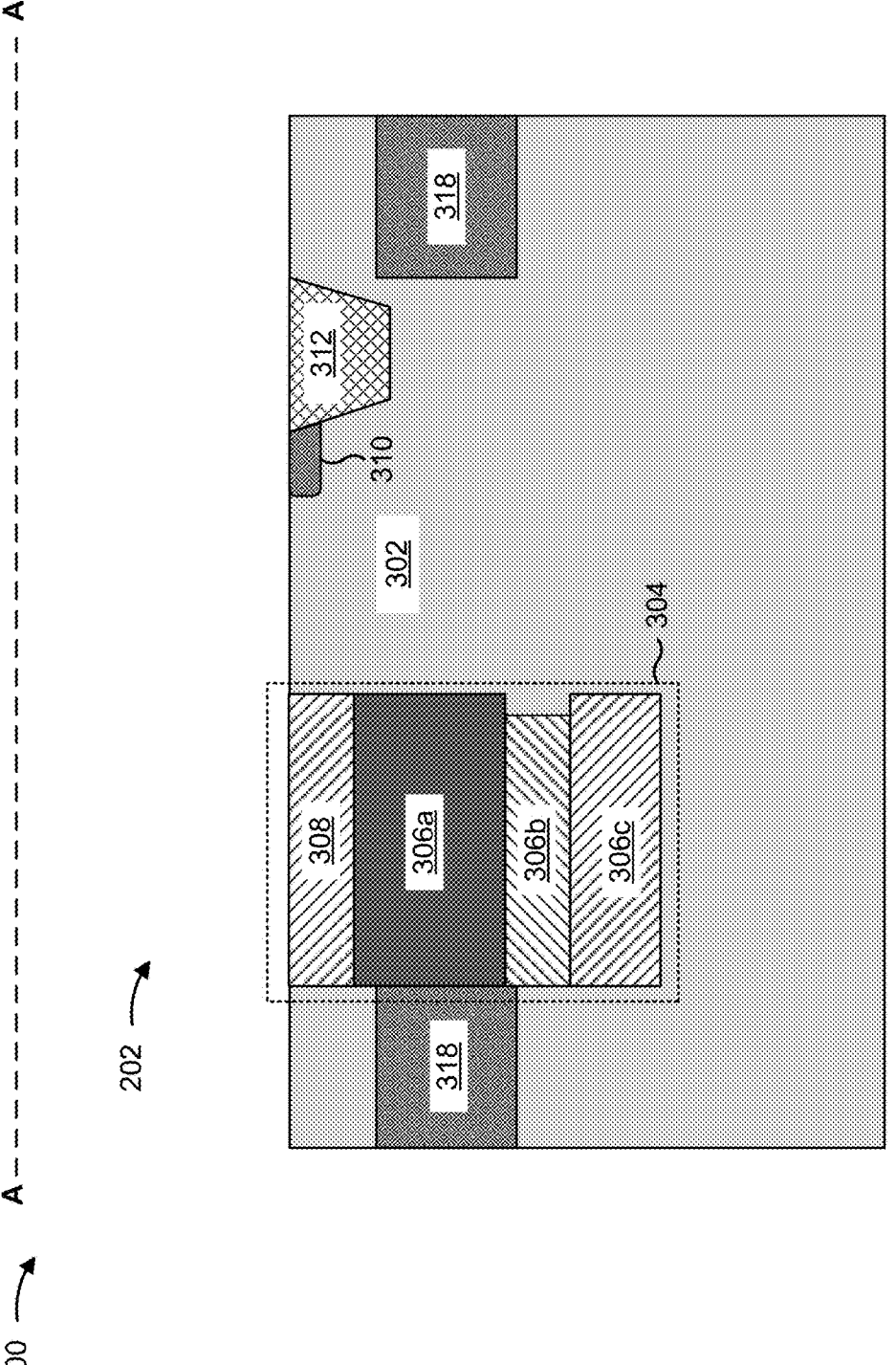
Figure 5F:
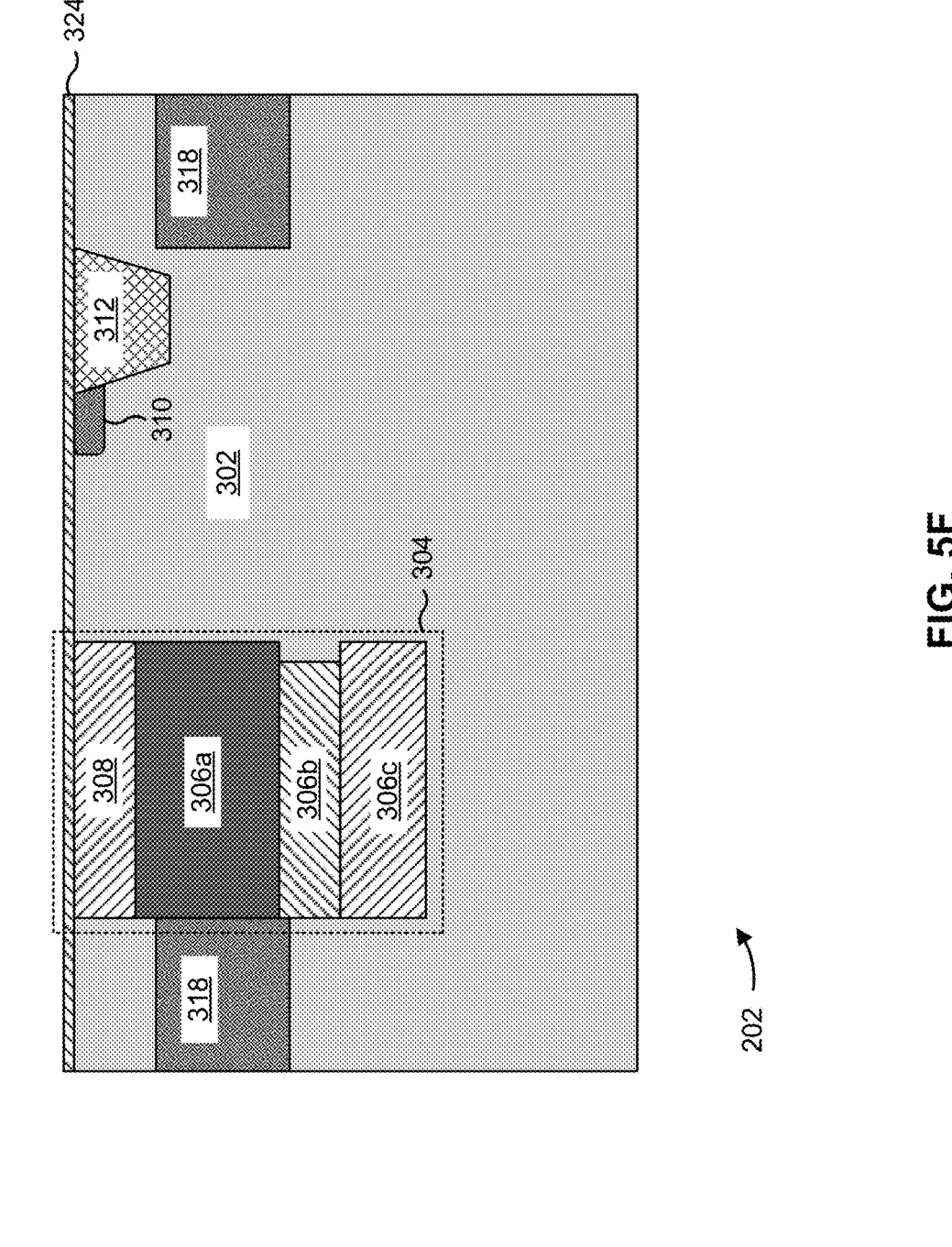
Figure 5G:
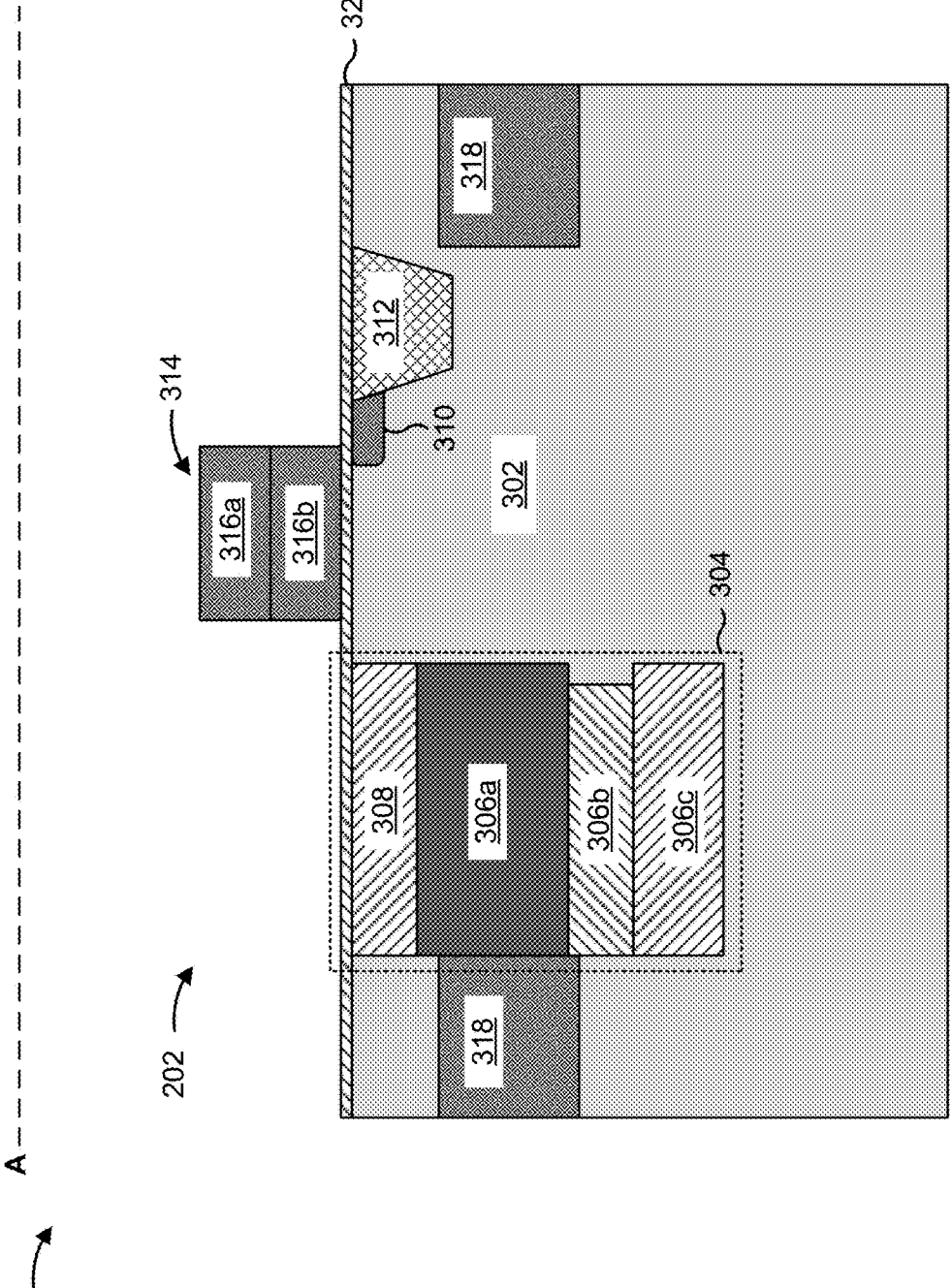
Figure 5H:
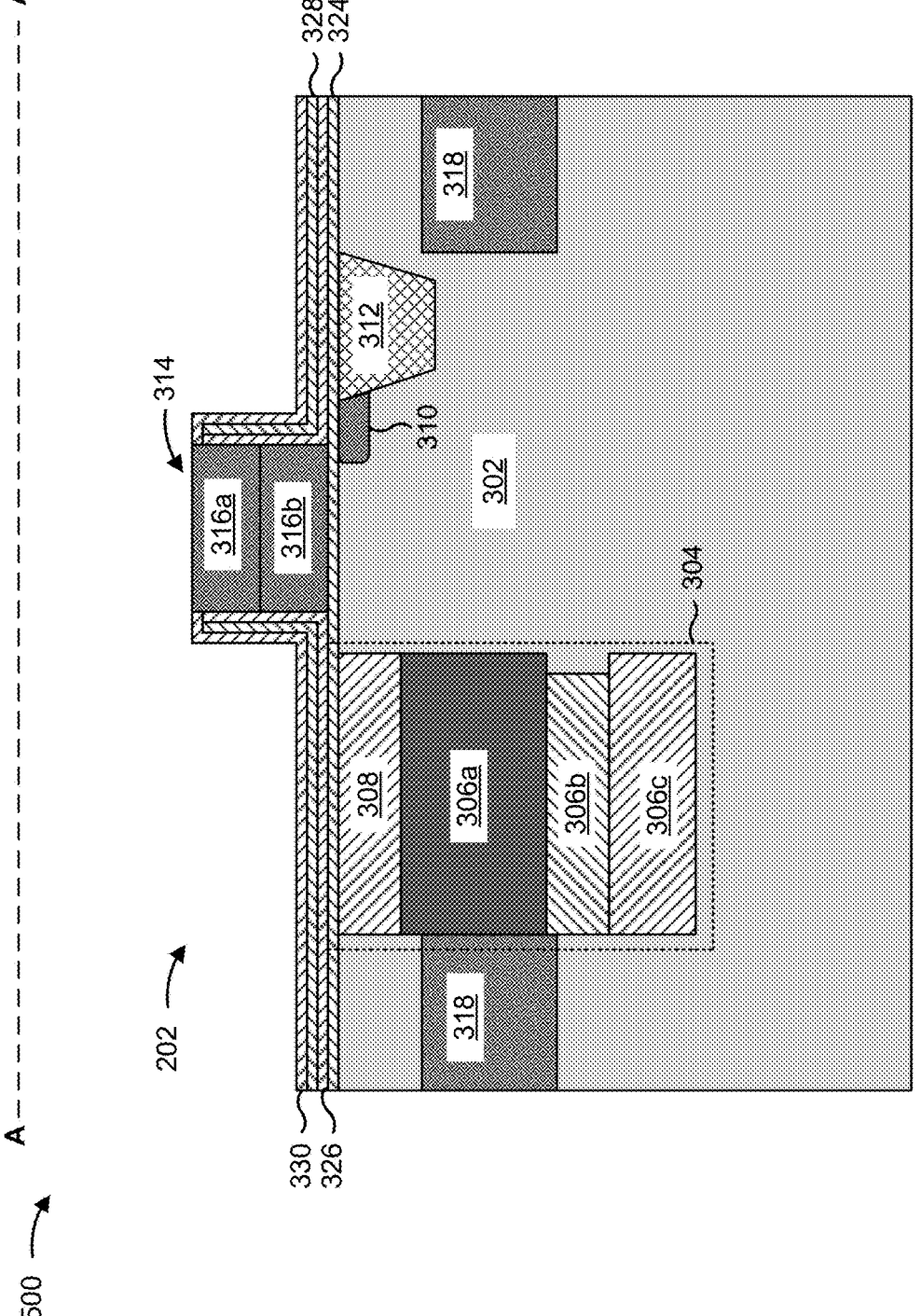
Figure 5I:
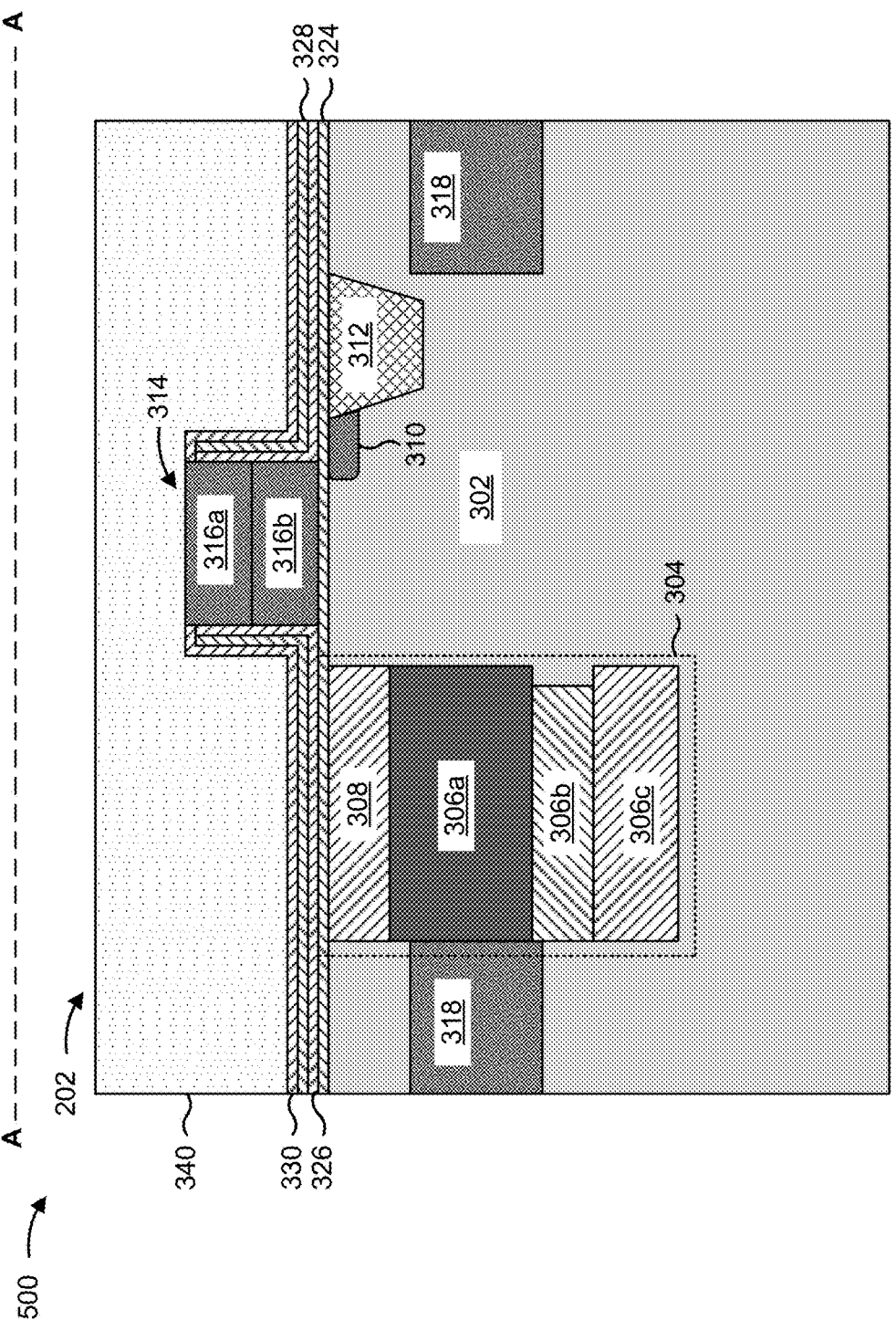
Figure 5J:
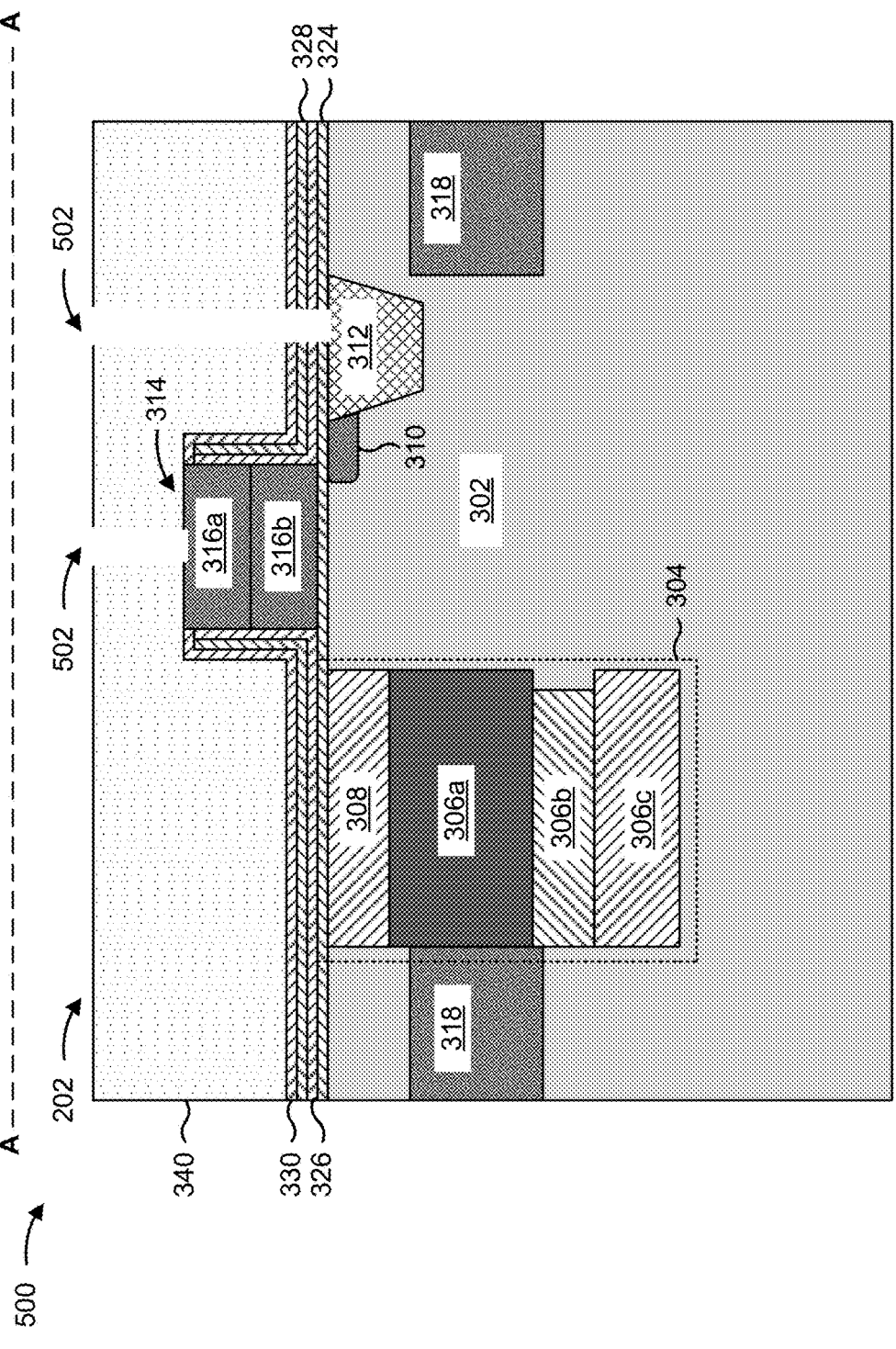
Figure 5K:
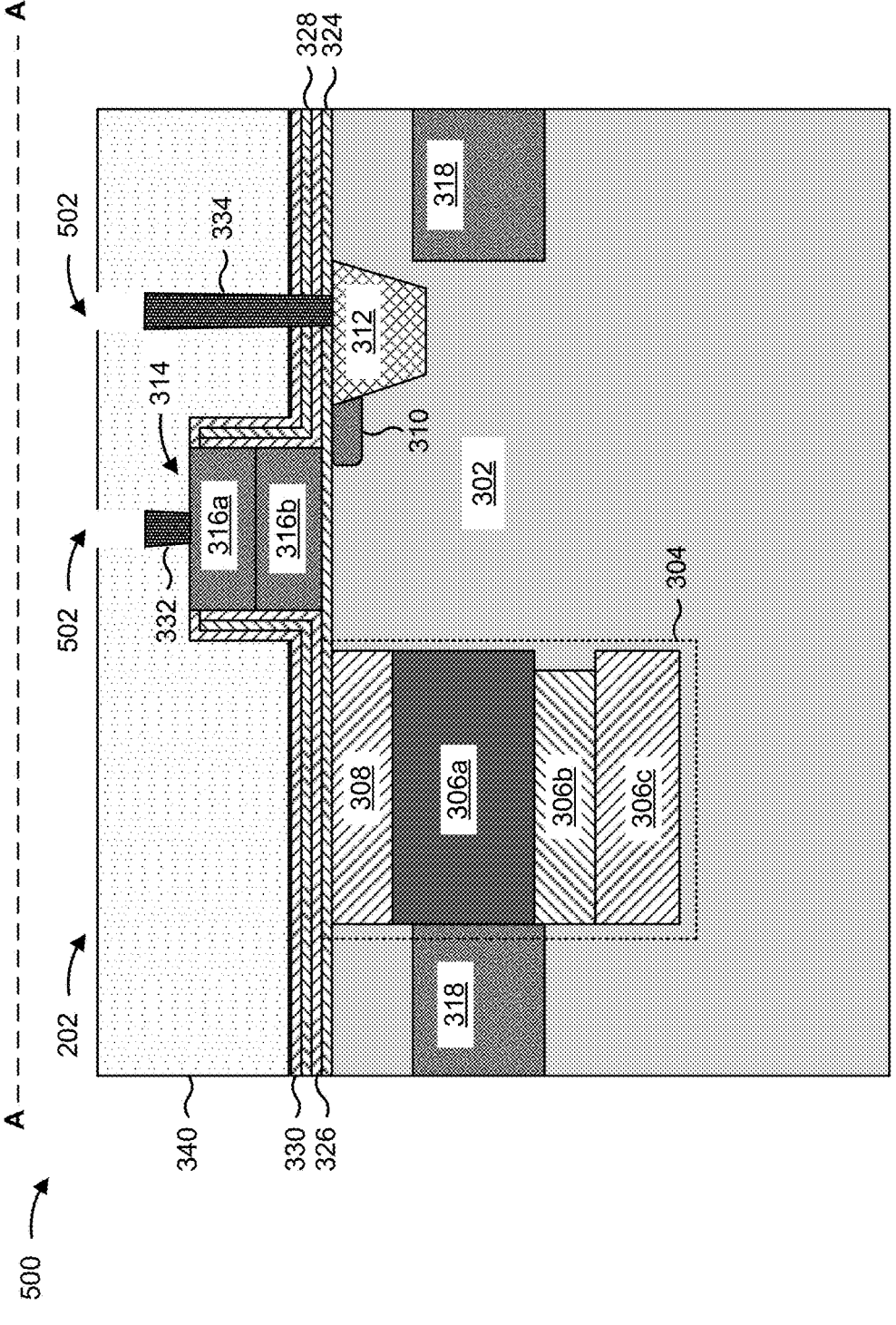
Figure 5L:
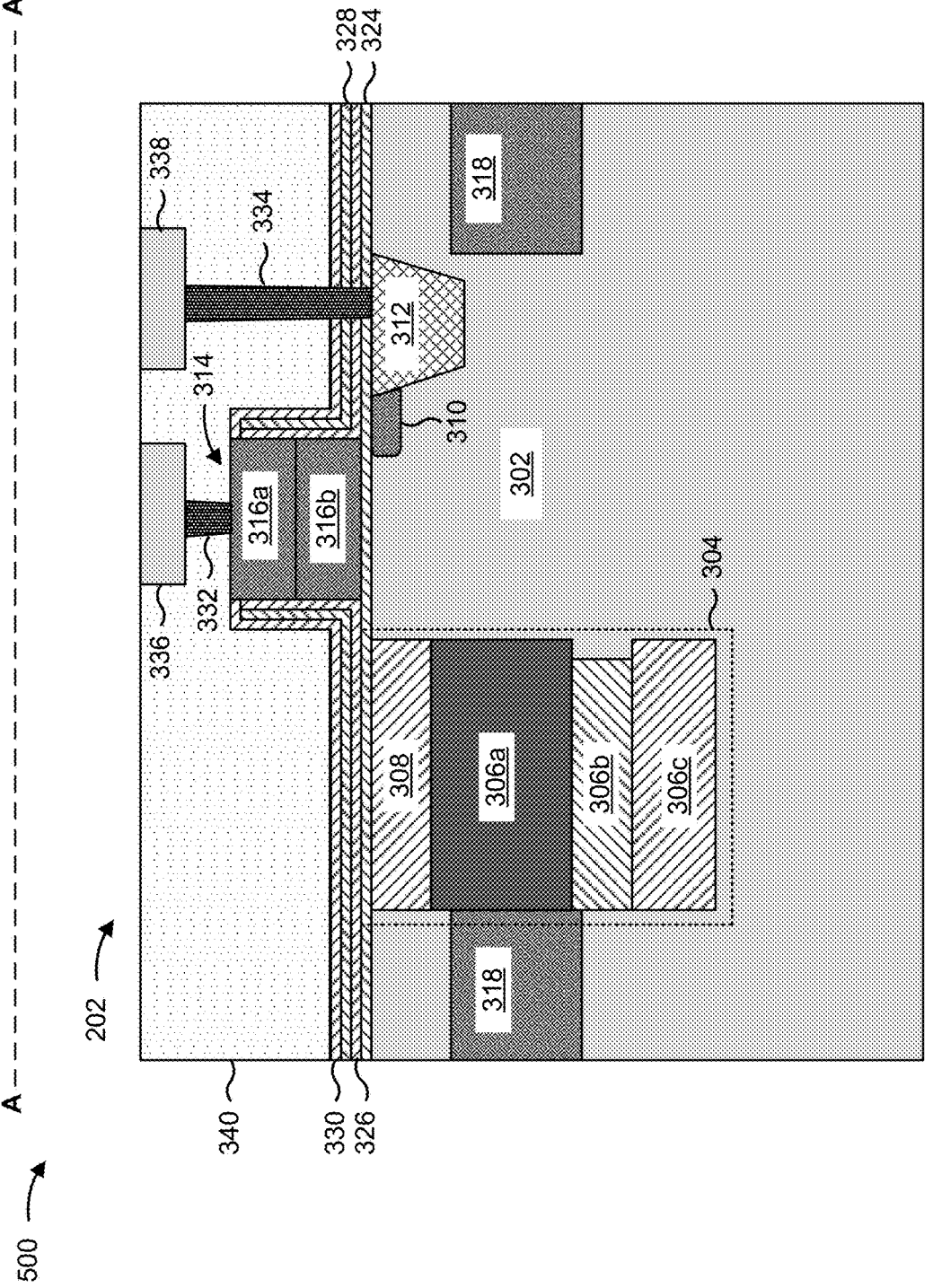
Figure 5M:
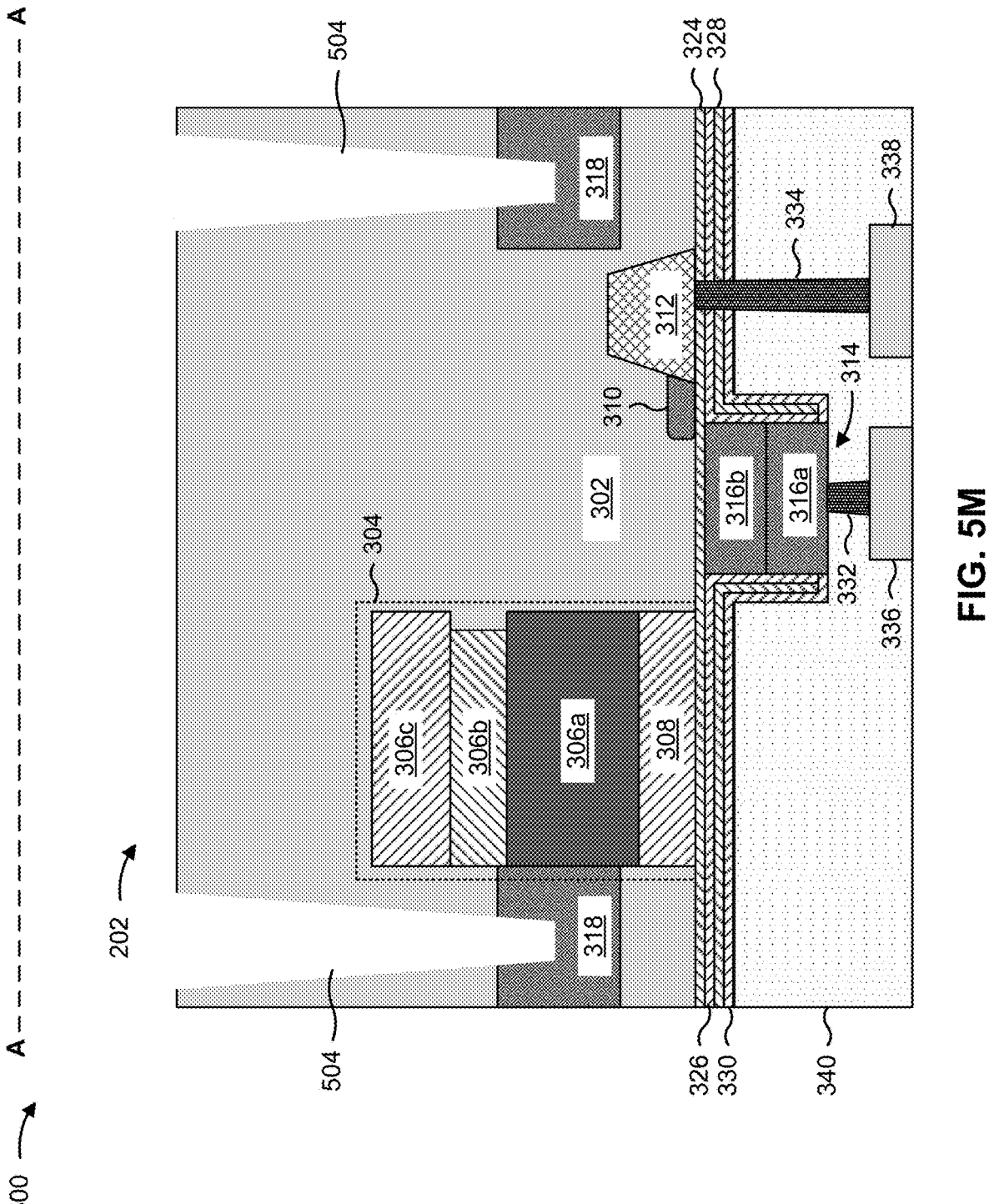
Figure 5P:
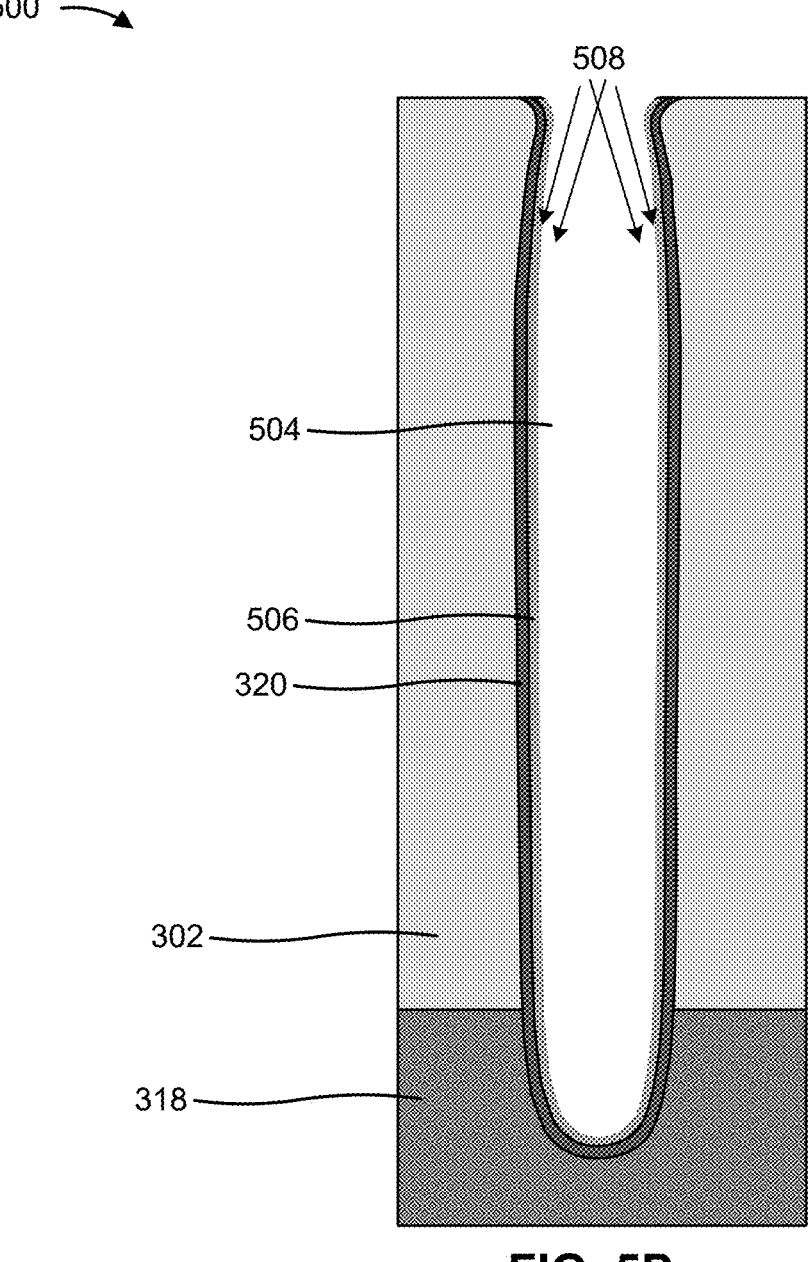
Figure 5T:
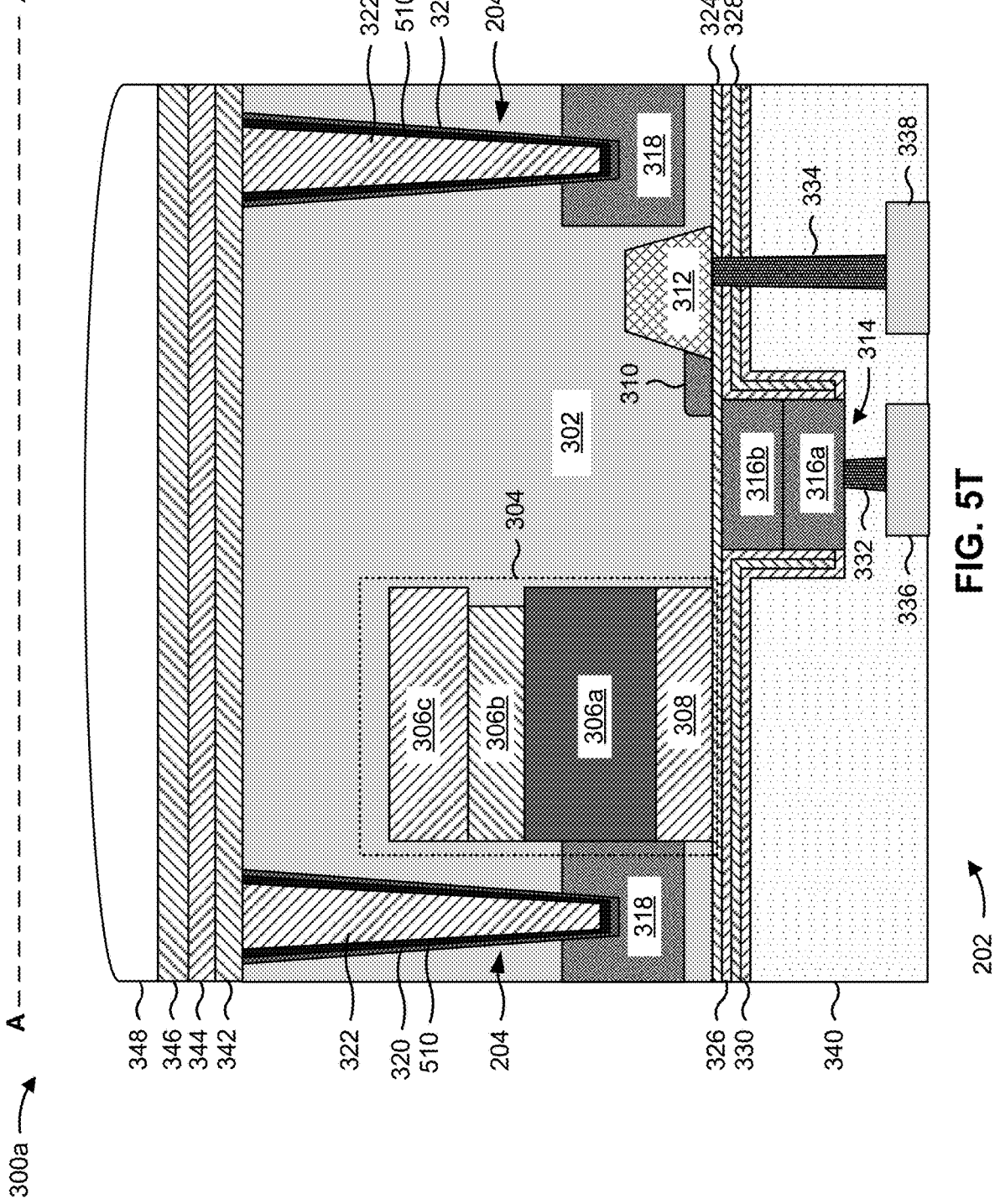

FIGS. 5A-5T are diagrams of an example implementation 500 described herein. Example implementation 500 may be an example process for forming a pixel sensor 202 described herein, such as the pixel sensor 202 described in connection with FIGS. 3A and 3B. One or more of FIGS. 5A-5T are illustrated along the cross-section A-A of the pixel array 200 in FIG. 2. As shown in FIG. 5A, the example process for forming the pixel sensor 202 may be performed in connection with the substrate 302.

As shown in FIG. 5B, the DPW 318 may be formed in the substrate 302. For example, the deep p-well region 318 may be formed (e.g., as a circle or ring shape in a top-down view) in the substrate 302 to provide electrical isolation and/or optical isolation for the pixel sensor 202. In some implementations, the ion implantation tool 114 dopes the substrate 302 by ion implantation to form the deep p-well region 318. For example, the ion implantation tool 114 may implant p+ ions into a first region of the substrate 302 to form the deep p-well region 318. In some implementations, the ion implantation tool 114 dopes a portion of the substrate 302 above the deep p-well region 318 with p+ ions to form a CPW above and/or over the deep p-well region 318. In some implementations, the substrate 302 may be doped using another doping technique such as diffusion to form the deep p-well region 318.

As shown in FIGS. 5C and 5D, a plurality of regions of the substrate 302 may be doped to form the photodiode 304. For example, and as illustrated in the example in FIG. 5C, the substrate 302 may be doped to form one or more n-type regions 306b and 306c. As another example, and as illustrated in the example in FIG. 5D, the substrate 302 may be doped to form an n-type region 306a and a p-type region 308.

In some implementations, the ion implantation tool 114 dopes the plurality of regions of the substrate 302 by one or more ion implantation operations. For example, the ion implantation tool 114 may implant p+ ions in the substrate 302 to form the p-type region 308, may implant n+ ions in the substrate to form the n-type region 306a over and/or on the p-type region 308, may implant n+ ions in the substrate 302 to form the n-type region 306b above and/or over the n-type region 306a, and/or may implant n+ ions in the substrate 302 to form the n-type region 306c above and/or over the n-type region 306b for a BS-DTI-CIS pixel sensor. As another example, the ion implantation tool 114 may implant n+ ions in the substrate 302 to form the n-type region 306c, may implant n+ ions in the substrate 302 to form the n-type region 306b above and/or over the n-type region 306c, may implant n+ ions in the substrate 302 to form the n-type region 306a above and/or over the n-type region 306b, and may implant p+ ions in the substrate 302 to form the p-type region 308 above and/or over the n-type region 306a for a FS-DTI-CIS pixel sensor. The ion implantation tool 114 may form the n-type region 306a, the n-type region 306b, the n-type region 306c, and the p-type region 308 within the perimeter of the deep p-well region 318. In some implementations, the plurality of regions of the substrate 302 may be doped using another doping technique such as diffusion to form the photodiode 304. In some implementations, the n-type region 306a, the n-type region 306b, and/or the n-type region 306c may be doped with different n-type dopant concentrations.

As shown in FIG. 5E, a plurality of regions of the substrate 302 may be doped to form the drain extension region 310 and the drain region 312. In some implementations, the ion implantation tool 114 dopes the plurality of regions of the substrate 302 by one or more ion implantation operations. For example, the ion implantation tool 114 may implant n$^+$ ions in the substrate 302 to form the drain region 312, and may implant n$^+$ ions in the substrate 302 adjacent to the drain region 312 to form the drain extension region 310. The ion implantation tool 114 may form the drain region 312 and the drain extension region 310 within the perimeter of the deep p-well region 318. In some implementations, the plurality of regions of the substrate 302 may be doped using another doping technique such as diffusion to form the drain region 312 and/or the drain extension region 310. In some implementations, the drain extension region 310 and the drain region 312 may be doped with different n-type dopant concentrations.

As shown in FIG. 5F, the gate dielectric layer 324 may be formed above and/or over the frontside surface of the substrate 302. The deposition tool 102 may deposit the gate dielectric layer 324 using a CVD technique, a PVD technique, an ALD technique, or another type of deposition technique. The planarization tool 110 may planarize the gate dielectric layer 324 after the gate dielectric layer 324 is deposited.

As shown in FIG. 5G, the transfer gate 314 may be formed over and/or on the gate dielectric layer 324. Moreover, the transfer gate 314 may be formed such that the transfer gate 314 is above and between the photodiode 304 and the drain region 312. This enables the transfer gate 314 to selectively form a conductive channel in the substrate 302 between the photodiode 304 and the drain region 312 to control the flow of electrons from the photodiode 304 to the drain region 312.

Forming the transfer gate 314 may include forming the lower transfer gate electrode region 316b over and/or on the gate dielectric layer 324, and forming the n-doped upper transfer gate electrode region 316a over and/or on the lower transfer gate electrode region 316b. The deposition tool 102 may deposit the n-doped upper transfer gate electrode region 316a and/or the lower transfer gate electrode region 316b using a CVD technique, a PVD technique, an ALD technique, an epitaxy technique, or another type of deposition technique; the plating tool 112 may deposit the transfer gate 314 in an electroplating operation; or a combination thereof. In some implementations, the ion implantation tool 114 forms the n-doped upper transfer gate electrode region 316a and/or the lower transfer gate electrode region 316b using one or more ion implantation operations. In some implementations, the planarization tool 110 planarizes the n-doped upper transfer gate electrode region 316a and/or the lower transfer gate electrode region 316b after formation of the n-doped upper transfer gate electrode region 316a and/or the lower transfer gate electrode region 316b.

As shown in FIG. 5H, the sidewall oxide layer 326 may be formed over and/or on the gate dielectric layer 324, on the sidewalls of the n-doped upper transfer gate electrode region 316a, and on the sidewalls of the lower transfer gate electrode region 316b. The deposition tool 102 may deposit the sidewall oxide layer 326 using a CVD technique, a PVD technique, an ALD technique, or another type of deposition technique. In some implementations, the deposition tool 102 deposits the sidewall oxide layer 326 using a conformal deposition technique. In some implementations, the planarization tool 110 planarizes the sidewall oxide layer 326 after the sidewall oxide layer 326 is deposited.

As further shown in FIG. 5H, the remote plasma oxide (RPO) layer 328 may be formed over and/or on the sidewall oxide layer 326, over the sidewalls of the n-doped upper transfer gate electrode region 316a, and over the sidewalls of the lower transfer gate electrode region 316b. The deposition tool 102 may deposit the remote plasma oxide layer 328 using a CVD technique, a PVD technique, an ALD technique, or another type of deposition technique. In some implementations, the deposition tool 102 deposits the remote plasma oxide layer 328 using a conformal deposition technique. In some implementations, the planarization tool 110 planarizes the remote plasma oxide layer 328 after the remote plasma oxide layer 328 is deposited.

As further shown in FIG. 5H, the contact etch stop layer (CESL) 330 may be formed over and/or on the remote plasma oxide layer 328, over the sidewalls of the n-doped upper transfer gate electrode region 316a, and over the sidewalls of the lower transfer gate electrode region 316b. The deposition tool 102 may deposit the contact etch stop layer 330 using a CVD technique, a PVD technique, an ALD technique, or another type of deposition technique. In some implementations, the deposition tool 102 deposits the contact etch stop layer 330 using a conformal deposition technique. In some implementations, the planarization tool 110 planarizes the contact etch stop layer 330 after the contact etch stop layer 330 is deposited.

As shown in FIG. 5I, the dielectric layer(s) 340 may be formed over and/or on the layers 324-330, and over and/or on the transfer gate 314. The deposition tool 102 may deposit the dielectric layer(s) 340 using a CVD technique, a PVD technique, and LAD technique, and/or another deposition technique.

As shown in FIG. 5J, the etch tool 108 forms openings 502 in the dielectric layer(s) 340. The etch tool 108 may form an opening 502 over the transfer gate 314 and through the dielectric layer(s) 340 to the transfer gate 314. The etch tool 108 may also form another opening 502 over the drain region 312 and through the dielectric layer(s) 340 to the drain region 312.

As shown in FIG. 5K, the interconnects 332 and 334 may be formed in the openings 502 in the dielectric layer(s) 340. The interconnect 332 may be formed such that the interconnect 332 is electrically connected with and/or contacts the transfer gate 314 (e.g., the n-doped upper transfer gate electrode region 316a of the transfer gate 314). The interconnect 334 may be formed such that the interconnect 334 is electrically connected with and/or contacts the drain region 312. The deposition tool 102 may deposit the material of the interconnects 332 and 334 using a CVD technique, a PVD technique, an ALD technique, or another type of deposition technique, the plating tool 112 may deposit the material of the interconnects 332 and 334 using an electroplating operation, or a combination thereof. The planarization tool 110 may planarize the interconnects 332 and 334 after the interconnects 332 and 334 are deposited.

As shown in FIG. 5L, the metallization layers 336 and 338 may be formed in the openings 502 in the dielectric layer(s) 340. In particular, the metallization layer 336 may be electrically connected to the transfer gate 314 by the interconnect 332, and the metallization layer 338 may be electrically connected to the drain region 312 by the interconnect 334. The deposition tool 102 may deposit the material of the metallization layers 336 and 338 using a CVD technique, a PVD technique, an ALD technique, or another type of deposition technique, the plating tool 112 may deposit the material of the metallization layers 336 and 338 using an electroplating operation, or a combination thereof. The planarization tool 110 may planarize the metallization layers 336 and 338 after the metallization layers 336 and 338 are deposited.

As shown in FIG. 5M, backside processing of the pixel sensor 202 may be performed. As part of the backside processing, the substrate 302 above the deep p-well region 318 may be etched to form a trench 504 (or another type of recess) in the substrate 302. The trench 504 may be etched into the substrate 302 from the backside surface of the substrate 302, which may be an opposing side of the substrate 302 on which the transfer gate 314 is formed. The trench 504 may be formed such that the trench 504 surrounds the one or more n-type regions 306, the p-type region 308, the drain extension region 310, the drain region 312, and the transfer gate 314. In some implementations, the trench 504 is formed such that the trench 504 partially extends into the deep p-well region 318.

The deposition tool 102 may form a photoresist layer on the substrate 302, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 302 (and, in some cases, portions of the deep p-well region 318) to form the trench 504. In some implementations, a photoresist removal tool removes the remaining portions of the photoresist layer (e.g., using a chemical stripper, a plasma asher, and/or another technique) after the etch tool 108 etches the substrate 302 (and, in some cases, the deep p-well region 318) to form the trench 504.

As shown in FIG. 5N, the trench 504 may be lined with a liner layer 320. The deposition tool 102 may form the liner layer 320 by conformal deposition such that the liner layer 320 is formed as a thin film that conforms to the shape and/or profile of the sidewalls and bottom surface of the trench 504. The liner layer 320 may be an aluminum oxide (or another type of metal oxide). The deposition tool 102 may form the liner layer 320 with a thickness in a range from approximately 10 Ångströms (Å) to approximately 70 Å. By selecting a thickness of at least 10 Å, reflectivity of a DTI structure 204 including the liner layer 320 is improved. By selecting a thickness of no more than 70 Å, the DTI structure 204 including the liner layer 320 will still include enough silicon oxide material to effectively insulate the photodiode 304.

As shown in FIG. 5O, the deposition tool 102 may conformally deposit a doping layer 506 on sidewalls of the trench 504 and on a bottom surface of the trench 504. In some implementations, the doping layer 506 includes a zinc compound, such as a zinc oxide (ZnO). Accordingly, the deposition tool 102 may use a zinc precursor, such as diethylzinc (DEZ or DEZn), with an ozone ($O_3$) carrier and/or a water vapor ($H_2O$) carrier. For example, the deposition tool 102 may form the doping layer 506 using ALD at a temperature that is in a range from approximately 150 degrees Celsius (° C.) to approximately 400° C. By selecting a temperature of at least 150° C., the carrier may remain gaseous in order to deposit the doping layer 506 on a bottom surface of the trench 504. By selecting a temperature of no more than 400° C., other portions of the pixel sensor 202 are not significantly modified by the ALD. In some implementations, the deposition tool 102 may form the doping layer 506 to a thickness that is in a range from approximately 5 Å to approximately 15 Å. By selecting a thickness of at least 5 Å, sufficient zinc is present for driving into the liner layer 320, as described in connection with FIG. 5P. By selecting a thickness of no more than 15 Å, the doping layer 506 may be removed, as described in connection with FIG. 5Q, without significant etching of other portions of the pixel sensor 202.

Additionally, or alternatively, the doping layer 506 includes a gallium compound, such as a gallium oxide (GaO). Accordingly, the deposition tool 102 may use a gallium precursor, such as trimethylgallium (TMG or TMGa), with an ozone ($O_3$) carrier and/or a water vapor ($H_2O$) carrier. For example, the deposition tool 102 may form the doping layer 506 using ALD at a temperature that is in a range from approximately 150° C. to approximately 400° C. By selecting a temperature of at least 150° C., the carrier may remain gaseous in order to deposit the doping layer 506 on a bottom surface of the trench 504. By selecting a temperature of no more than 400° C., other portions of the pixel sensor 202 are not significantly modified by the ALD. In some implementations, the deposition tool 102 may form the doping layer 506 to a thickness that is in a range from approximately 5 Å to approximately 15 Å. By selecting a thickness of at least 5 Å, sufficient gallium is present for driving into the liner layer 320, as described in connection with FIG. 5P. By selecting a thickness of no more than 15 Å, the doping layer 506 may be removed, as described in connection with FIG. 5Q, without significant etching of other portions of the pixel sensor 202.

As shown in FIG. 5P, the ion implantation tool 114 may drive zinc and/or gallium atoms from the doping layer 506 into the liner layer 320 using a plasma 508. For example, the ion implantation tool 114 may use a hydrogen ($H_2$) plasma. For example, the ion implantation tool 114 may bombard the doping layer 506 with hydrogen plasma at a temperature that is in a range from approximately 350° C. to approximately 450° C. By selecting a temperature of at least 350° C., the plasma is sufficiently energized in order to drive the zinc and/or gallium atoms into the liner layer 320. By selecting a temperature of no more than 450° C., other portions of the pixel sensor 202 are not significantly modified by the ion implantation tool 114. Using the doping layer 506 to drive zinc and/or gallium atoms into the liner layer 320 results in significant doping, which further reduces free holes at the interface between the liner layer 320 and the substrate 302.

As shown in FIG. 5Q, the doping layer 506 may be removed. For example, the etch tool 108 may perform a wet etching operation (e.g., using standard clean 1 (SC1), which is a mixture of $NH_4OH$, $H_2O_2$, and $H_2O$, or standard clean 2 (SC2), which is a mixture of HCl, $H_2O_2$, and $H_2O$) to remove the doping layer 506. The etch tool 108 may perform the wet etch for an amount of time proportional to a thickness of the doping layer 506, such that the liner layer 320 is not significantly etched during the wet etch process.

Instead of removing the doping layer 506, some implementations may form the doping layer 506 between the liner layer 320 and the substrate 302, as described in connection with FIGS. 6A-6D. Accordingly, the etching described in connection with FIG. 5Q may be omitted, which conserves raw materials and reduces manufacturing time.

In some implementations, and as shown in FIG. 5R, the deposition tool 102 may conformally deposit one or more additional layers 510 on sidewalls of the trench 504 and on a bottom surface of the trench 504. In some implementations, the layer(s) 510 includes an oxide, such as a hafnium oxide (HfO). Accordingly, the deposition tool 102 may form the oxide using ALD at a temperature that is in a range from approximately 350° C. to approximately 450° C. By selecting a temperature of at least 350° C., a carrier may remain gaseous in order to deposit the oxide on a bottom surface of the trench 504. By selecting a temperature of no more than 450° C., other portions of the pixel sensor 202 are not significantly modified by the ALD. In some implementations, the deposition tool 102 may form the oxide to a thickness that is in a range from approximately 10 Å to approximately 70 Å. By selecting a thickness of at least 10 Å, reflectivity of a DTI structure 204 including the oxide is improved. By selecting a thickness of no more than 70 Å, the DTI structure 204 including the oxide will still include enough silicon oxide material to effectively insulate the photodiode 304.

Additionally, or alternatively, the layer(s) 510 includes a high-κ material, such as a tantalum oxide ($Ta_2O_5$). Accordingly, the deposition tool 102 may form the high-κ material using ALD at a temperature that is in a range from approximately 350° C. to approximately 450° C. By selecting a temperature of at least 350° C., a carrier may remain gaseous in order to deposit the high-κ material on a bottom surface of the trench 504. By selecting a temperature of no more than 450° C., other portions of the pixel sensor 202 are not significantly modified by the ALD. In some implementations, the deposition tool 102 may form the high-κ material to a thickness that is in a range from approximately 400 Å to approximately 600 Å. By selecting a thickness of at least 400 Å, reflectivity of a DTI structure 204 including the high-κ material is improved. By selecting a thickness of no more than 600 Å, the DTI structure 204 including the high-κ material will still include enough silicon oxide material to effectively insulate the photodiode 304.

As shown in FIG. 5S, the trench 504 may be filled with an oxide material to form an oxide layer 322 of the DTI structure 204. The deposition tool 102 may form the oxide layer 322 over the liner layer 320 (and/or the layer(s) 510). The deposition tool 102 may deposit the oxide layer 322 using a CVD technique, a PVD technique, an ALD technique, or another type of deposition technique. In some implementations, the deposition tool 102 uses an PEALD technique to form the oxide layer 322. The planarization tool 110 may planarize the oxide layer 322 after the oxide layer 322 is deposited in the trench 504 such that a top surface of the oxide layer 322 and a backside surface of the substrate 302 are approximately a same height.

As shown in FIG. 5T, additional layers and/or structures may be formed for the pixel sensor 202. For example, a $p^+$ ion layer 342, an ARC 344, a color filter layer 346, and a micro-lens layer 348 may be formed over the backside side of the substrate 302 (e.g., over the one or more layers 320 on the backside of the substrate 302). The deposition tool 102 may deposit the $p^+$ ion layer 342, the ARC 344, the color filter layer 346, and the micro-lens layer 348 using a CVD technique, a PVD technique, an ALD technique, or another type of deposition technique. The $p^+$ ion layer 342 may be formed over and/or on the substrate 302. The ARC 344 may be formed over and/or on the $p^+$ ion layer 342. The color filter layer 346 may be formed over and/or on the ARC 344. The micro-lens layer 348 may be formed over and/or on the color filter layer 346. In some implementations, the planarization tool 110 planarizes the $p^+$ ion layer 342, the ARC 344, and/or the color filter layer 346.

As indicated above, FIGS. 5A-5T are provided as an example. Other examples may differ from what is described with regard to FIGS. 5A-5T.

FIGS. 6A-6D are diagrams of an example implementation 600 described herein. Example implementation 600 is part of an example process for forming a pixel sensor 202 described herein, such as the pixel sensor 202 described in connection with FIGS. 3A and 3B. For example, the operations described in connection with FIGS. 6A-6D may substitute for the operations described in connection with FIGS. 5N-5S.

As shown in FIG. 6A, deposition tool 102 may conformally deposit a doping layer 506 on sidewalls of a trench 504 (e.g., in substrate 302) and on a bottom surface of the trench 504. The deposition tool 102 may form the doping layer 506 by conformal deposition such that the doping layer 506 is formed as a thin film that conforms to the shape and/or profile of the sidewalls and bottom surface of the trench 504. In some implementations, the doping layer 506 includes a zinc compound, such as a zinc oxide (ZnO). Accordingly, the deposition tool 102 may use a zinc precursor, such as diethylzinc (DEZ or DEZn), with an ozone ($O_3$) carrier and/or a water vapor ($H_2O$) carrier. For example, the deposition tool 102 may form the doping layer 506 using ALD at a temperature that is in a range from approximately 150° C. to approximately 400° C. By selecting a temperature of at least 150° C., the carrier may remain gaseous in order to deposit the doping layer 506 on a bottom surface of the trench 504. By selecting a temperature of no more than 400° C., other portions of the pixel sensor 202 are not significantly modified by the ALD. In some implementations, the deposition tool 102 may form the doping layer 506 to a thickness that is in a range from approximately 5 Å to approximately 15 Å. By selecting a thickness of at least 5 Å, sufficient zinc is present for bonding with holes at an interface with the substrate 302. By selecting a thickness of no more than 15 Å, the doping layer 506 does not significantly impact the reflectivity of a DTI structure 204 formed in the trench 504.

Additionally, or alternatively, the doping layer 506 includes a gallium compound, such as a gallium oxide (GaO). Accordingly, the deposition tool 102 may use a gallium precursor, such as trimethylgallium (TMG or TMGa), with an ozone ($O_3$) carrier and/or a water vapor ($H_2O$) carrier. For example, the deposition tool 102 may form the doping layer 506 using ALD at a temperature that is in a range from approximately 150° C. to approximately 400° C. By selecting a temperature of at least 150° C., the carrier may remain gaseous in order to deposit the doping layer 506 on a bottom surface of the trench 504. By selecting a temperature of no more than 400° C., other portions of the pixel sensor 202 are not significantly modified by the ALD. In some implementations, the deposition tool 102 may form the doping layer 506 to a thickness that is in a range from approximately 5 Å to approximately 15 Å. By selecting a thickness of at least 5 Å, sufficient gallium is present for bonding with holes at an interface with the substrate 302. By selecting a thickness of no more than 15 Å, the doping layer 506 does not significantly impact the reflectivity of a DTI structure 204 formed in the trench 504.

As shown in FIG. 6B, the trench 504 may be lined with a liner layer 320. The deposition tool 102 may form the liner layer 320 by conformal deposition such that the liner layer 320 is formed as a thin film that conforms to the shape and/or profile of the sidewalls and bottom surface of the trench 504. The liner layer 320 may be an aluminum oxide (or another type of metal oxide). The deposition tool 102 may form the liner layer 320 with a thickness in a range from approximately 10 Å to approximately 70 Å. By selecting a thickness of at least 10 Å, reflectivity of a DTI structure 204 including the liner layer 320 is improved. By selecting a thickness of no more than 70 Å, the DTI structure 204 including the liner layer 320 will still include enough silicon oxide material to effectively insulate the photodiode 304.

In some implementations, and as shown in FIG. 6C, the deposition tool 102 may conformally deposit one or more additional layers 510 on sidewalls of the trench 504 and on a bottom surface of the trench 504. In some implementations, the layer(s) 510 includes an oxide, such as a hafnium oxide (HfO). Accordingly, the deposition tool 102 may form the oxide using ALD at a temperature that is in a range from approximately 350° C. to approximately 450° C. By selecting a temperature of at least 350° C., a carrier may remain gaseous in order to deposit the oxide on a bottom surface of the trench 504. By selecting a temperature of no more than 450° C., other portions of the pixel sensor 202 are not significantly modified by the ALD. In some implementations, the deposition tool 102 may form the oxide to a thickness that is in a range from approximately 10 Å to approximately 70 Å. By selecting a thickness of at least 10 Å, reflectivity of a DTI structure 204 including the oxide is improved. By selecting a thickness of no more than 70 Å, the DTI structure 204 including the oxide will still include enough silicon oxide material to effectively insulate the photodiode 304.

Additionally, or alternatively, the layer(s) 510 includes a high-κ material, such as a tantalum oxide ($Ta_2O_5$). Accordingly, the deposition tool 102 may form the high-κ material using ALD at a temperature that is in a range from approximately 350° C. to approximately 450° C. By selecting a temperature of at least 350° C., a carrier may remain gaseous in order to deposit the high-κ material on a bottom surface of the trench 504. By selecting a temperature of no more than 450° C., other portions of the pixel sensor 202 are not significantly modified by the ALD. In some implementations, the deposition tool 102 may form the high-κ material to a thickness that is in a range from approximately 400 Å to approximately 600 Å. By selecting a thickness of at least 400 Å, reflectivity of a DTI structure 204 including the high-κ material is improved. By selecting a thickness of no more than 600 Å, the DTI structure 204 including the high-κ material will still include enough silicon oxide material to effectively insulate the photodiode 304.

As shown in FIG. 6D, the trench 504 may be filled with an oxide material to form an oxide layer 322 of the DTI structure 204. The deposition tool 102 may form the oxide layer 322 over the liner layer 320 (and/or the layer(s) 510). The deposition tool 102 may deposit the oxide layer 322 using a CVD technique, a PVD technique, an ALD technique, or another type of deposition technique. In some implementations, the deposition tool 102 uses an PEALD technique to form the oxide layer 322. The planarization tool 110 may planarize the oxide layer 322 after the oxide layer 322 is deposited in the trench 504 such that a top surface of the oxide layer 322 and a backside surface of the substrate 302 are approximately a same height.

Accordingly, the pixel sensor 202 may be finalized as described in connection with FIG. 5T. As indicated above, FIGS. 6A-6D are provided as an example. Other examples may differ from what is described with regard to FIGS. 6A-6D.

Figure 7:
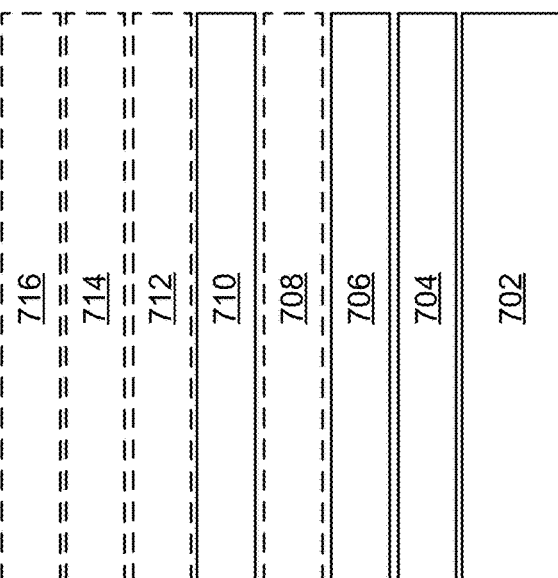
FIG. 7 is a diagram on an example implementation described herein.

FIG. 7 is a diagram of an example implementation 700 described herein. Example implementation 700 is an example processing stack for a DTI structure 204. As shown by reference number 702, example implementation 700 may include forming inter-layer dielectric (e.g., between a substrate 302 and an HK1 layer). As shown by reference number 704, over the inter-layer dielectric may be formed an HK1 layer (e.g., liner layer 320). Further, as shown by reference number 706, example implementation 700 may include forming a doping layer 506 (e.g., as described in connection with FIGS. 5N-5S), driving dopants into the HK1 layer, and removing the doping layer 506.

In some implementations, as shown by reference number 708, postdeposition annealing may be formed (e.g., to reduce gaps in the liner layer 320). Accordingly, as shown by reference number 710, over the HK1 may be formed an HK2 layer (e.g., an additional layer 510).

As shown by reference number 712, example implementation 700 may further include forming a nitride (e.g., titanium nitride (TiN)) without post metal annealing. In some implementations, as shown by reference number 714, a silicon cap may be formed. Finally, as shown by reference number 716, a post capping anneal may be performed before the formation of oxide layer 322 of the DTI structure 204.

As indicated above, FIG. 7 is provided as an example. Other examples may differ from what is described with regard to FIG. 7.

FIG. 8A is a diagram of an example implementation 800 described herein. Example implementation 800 includes a pixel sensor 202 with photodiodes 304a and 304b. The pixel sensor further includes color filter layers 346a and 346b and micro-lens layers 348a and 348b associated with the photodiodes 304a and 304b, respectively.

The DTI structures 204 may each include a liner layer 320 between the substrate 302 of the pixel group 400 and an oxide layer 322 of the DTI structure. The liner layer 320 may include a metal oxide, such as an aluminum oxide (AlO), among other examples. In some implementations, one or more additional high-κ layers, such as a hafnium oxide (HfO) and/or a tantalum oxide ($Ta_2O_5$), may be included between the oxide layer 322 and the liner layer 320 to further increase reflectivity of the DTI structure.

The pixel sensor 202 further includes a CMOS image sensor (CIS) chip 802 that includes transfer gates 314a and 314b associated with the photodiodes 304a and 304b, respectively. The CIS chip 802 further includes a reset transistor (RST) 804 and a source follower (SF) 806. The CIS chip 802 connects to an application-specific integrated circuit (ASIC) chip 808 that controls voltages applied to the transfer gates 314a and 314b, respectively.

Figure 8B:
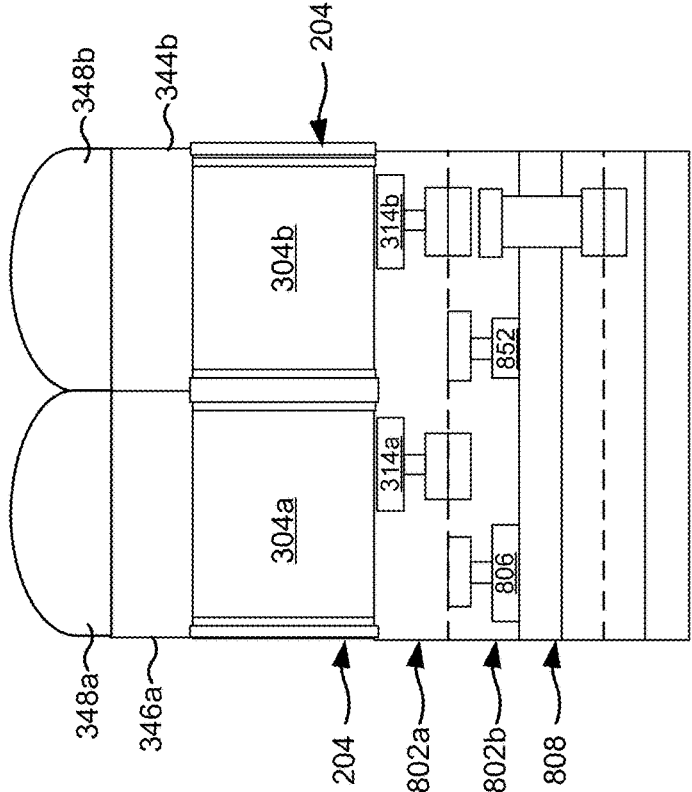

FIG. 8B is a diagram of an example implementation 850 described herein. Example implementation 850 is similar to example implementation 800 but includes a first CIS chip 802a that includes transfer gates 314a and 314b associated with the photodiodes 304a and 304b, respectively, connected to a second CIS chip 802b that includes a row selector (RSL) 852 and an SF 806. The CIS chip 802b connects to an ASIC chip 808 that controls voltages applied to the transfer gates 314a and 314b, respectively.

As indicated above, FIGS. 8A-8B are provided as examples. Other examples may differ from what is described with regard to FIGS. 8A-8B.

Figure 9:
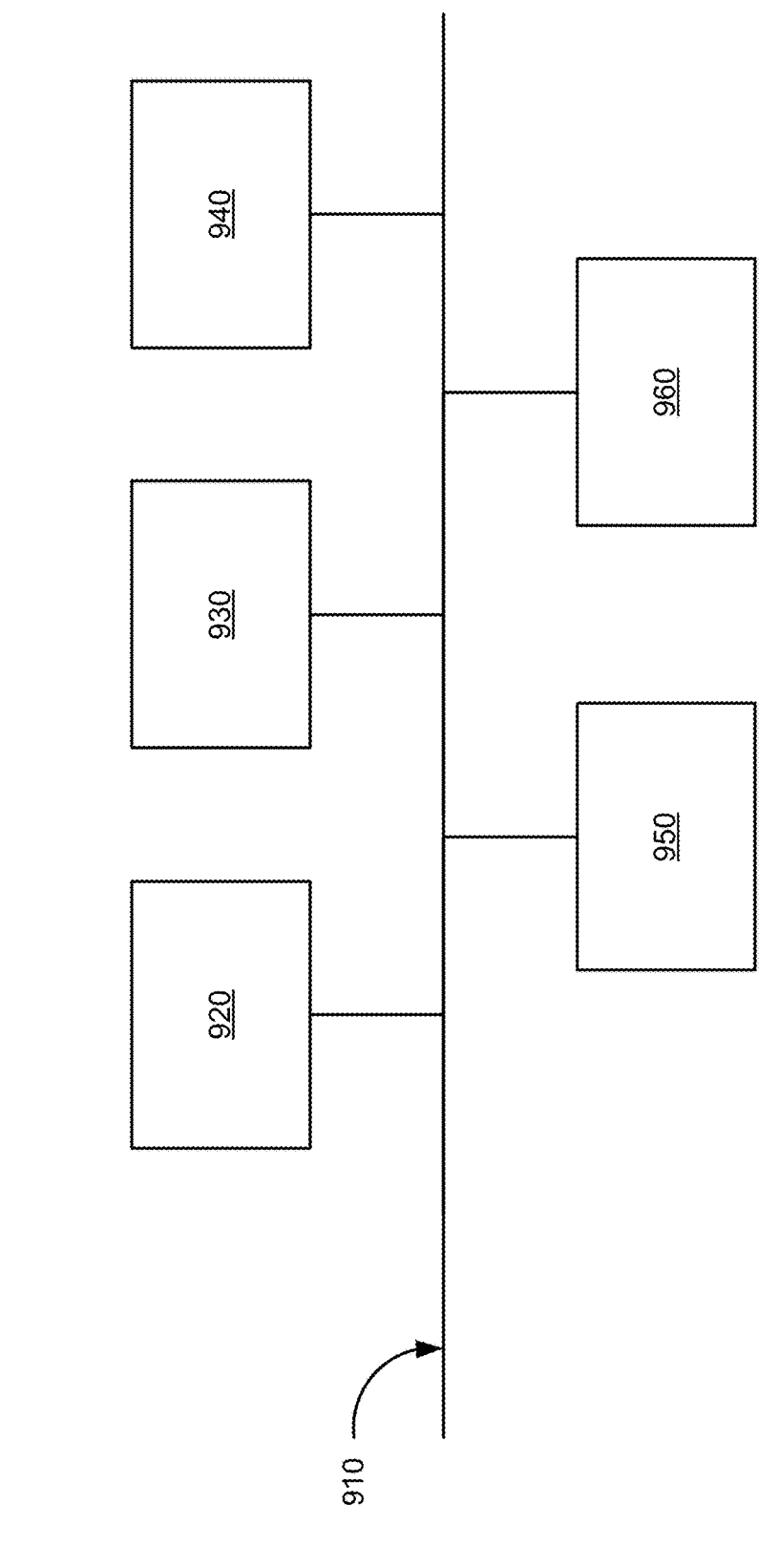
FIG. 9 is a diagram of example components of one or more devices of FIG. 1 described herein.

FIG. 9 is a diagram of example components of a device 900. In some implementations, one or more of the semiconductor processing tools 102-116 and/or the wafer/die transport tool 118 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

FIG. 10 is a flowchart of an example process 1000 associated with forming semiconductor isolation structures described herein. In some implementations, one or more process blocks of FIG. 10 are performed by one or more semiconductor processing tools (e.g., one or more of the semiconductor processing tools 102-116). Additionally, or alternatively, one or more process blocks of FIG. 10 may be performed by one or more components of device 700, such as processor 720, memory 730, input component 740, output component 750, and/or communication component 760.

As shown in FIG. 10, process 1000 may include forming, in a substrate, a photodiode for a pixel sensor of a pixel array (block 1010). For example, one or more of the semiconductor processing tools 102-116 may form, in a substrate 302, a photodiode 304 for a pixel sensor 202 of a pixel array 200, as described herein.

As further shown in FIG. 10, process 1000 may include forming, in the substrate, a trench adjacent to the photodiode (block 1020). For example, one or more of the semiconductor processing tools 102-116 may form, in the substrate 302, a trench 504 adjacent to the photodiode 304, as described herein.

As further shown in FIG. 10, process 1000 may include forming a liner layer on sidewalls of the trench and on a bottom surface of the trench (block 1030). For example, one or more of the semiconductor processing tools 102-116 may form a liner layer 320 on sidewalls of the trench 504 and on a bottom surface of the trench 504, as described herein.

As further shown in FIG. 10, process 1000 may include forming a doping layer over the liner layer (block 1040). For example, one or more of the semiconductor processing tools 102-116 may form a doping layer 506 over the liner layer 320, as described herein.

As further shown in FIG. 10, process 1000 may include driving zinc, gallium, or a combination thereof from the doping layer into the liner layer (block 1050). For example, one or more of the semiconductor processing tools 102-116 may drive zinc, gallium, or a combination thereof from the doping layer 506 into the liner layer 320, as described herein.

As further shown in FIG. 10, process 1000 may include removing the doping layer (block 1060). For example, one or more of the semiconductor processing tools 102-116 may remove the doping layer 506, as described herein.

As further shown in FIG. 10, process 1000 may include filling the trench with a dielectric material over the liner layer to form a DTI structure (block 1070). For example, one or more of the semiconductor processing tools 102-116 may fill the trench 504 with a dielectric material 322 over the liner layer 320 to form a DTI structure 204, as described herein.

Process 1000 may include additional implementations, such as any single implementation or any combination of implementations described below and/or in connection with one or more other processes described elsewhere herein.

In a first implementation, driving zinc, gallium, or a combination thereof into the liner layer 320 results in electron-hole bonds at an interface between the liner layer 320 and the substrate 302.

In a second implementation, alone or in combination with the first implementation, the doping layer 506 includes a zinc oxide, a gallium oxide, or a combination thereof.

In a third implementation, alone or in combination with one or more of the first and second implementations, a thickness of the doping layer 506 is in a range from approximately 5 Å to approximately 15 Å.

In a fourth implementation, alone or in combination with one or more of the first through third implementations, driving zinc, gallium, or a combination thereof into the liner layer 320 results in an increased breakdown voltage and a reduced power consumption for the photodiode 304.

In a fifth implementation, alone or in combination with one or more of the first through fourth implementations, process 1000 includes forming an oxide layer 510 over the liner layer 320, such that the dielectric material 322 is over the oxide layer 510 in the DTI structure 204.

In a sixth implementation, alone or in combination with one or more of the first through fifth implementations, process 1000 includes forming a high-κ layer 510 over the liner layer 320, such that the dielectric material 322 is over the high-κ layer 510 in the DTI structure 204.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

FIG. 11 is a flowchart of an example process 1100 associated with forming semiconductor isolation structures described herein. In some implementations, one or more process blocks of FIG. 11 are performed by one or more semiconductor processing tools (e.g., one or more of the semiconductor processing tools 102-116). Additionally, or alternatively, one or more process blocks of FIG. 11 may be performed by one or more components of device 700, such as processor 720, memory 730, input component 740, output component 750, and/or communication component 760.

As shown in FIG. 11, process 1100 may include forming, in a substrate, a photodiode for a pixel sensor of a pixel array (block 1110). For example, one or more of the semiconductor processing tools 102-116 may form, in a substrate 302, a photodiode 304 for a pixel sensor 202 of a pixel array 200, as described herein.

As further shown in FIG. 11, process 1100 may include forming, in the substrate, a trench adjacent to the photodiode (block 1120). For example, one or more of the semiconductor processing tools 102-116 may form, in the substrate 302, a trench 504 adjacent to the photodiode 304, as described herein.

As further shown in FIG. 11, process 1100 may include forming a doping layer on sidewalls of the trench and on a bottom surface of the trench (block 1130). For example, one or more of the semiconductor processing tools 102-116 may form a doping layer 506 on sidewalls of the trench 504 and on a bottom surface of the trench 504, as described herein. The doping layer 506 may comprise zinc, gallium, or a combination thereof.

As further shown in FIG. 11, process 1100 may include forming a liner layer over the doping layer (block 1140). For example, one or more of the semiconductor processing tools 102-116 may form a liner layer 320 over the doping layer 506, as described herein.

As further shown in FIG. 11, process 1100 may include filling the trench with a dielectric material over the liner layer to form a DTI structure (block 1150). For example, one or more of the semiconductor processing tools 102-116 may fill the trench 504 with a dielectric material 322 over the liner layer 320 to form a DTI structure 204, as described herein.

Process 1100 may include additional implementations, such as any single implementation or any combination of implementations described below and/or in connection with one or more other processes described elsewhere herein.

In a first implementation, depositing the doping layer 506 includes forming the doping layer 506 using ALD at a temperature that is in a range from approximately 150° C. to approximately 400° C.

In a second implementation, alone or in combination with the first implementation, the doping layer 506 results in an increased breakdown voltage and a reduced power consumption for the photodiode 304.

In a third implementation, alone or in combination with one or more of the first and second implementations, the doping layer 506 results in electron-hole bonds at an interface between the liner layer 320 and the substrate 302.

In a fourth implementation, alone or in combination with one or more of the first through third implementations, process 1100 includes forming an oxide layer 510 over the liner layer 320 using ALD at a temperature that is in a range from approximately 350° C. to approximately 450° C.

In a fifth implementation, alone or in combination with one or more of the first through fourth implementations, process 1100 includes forming a high-κ layer 510 over the liner layer 320 using ALD at a temperature that is in a range from approximately 350° C. to approximately 450° C.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, doping a liner of a trench isolation structure with zinc (Zn) and/or gallium (Ga) reduces dark current from a photodiode. For example, the zinc and/or gallium may be deposited on a temporary oxide layer and driven into the HK1 layer surrounding a BDTI structure and an interface between the HK1 layer and surrounding silicon. In another example, the zinc and/or gallium may be deposited on an oxide layer between the HK1 layer and surrounding silicon. As a result, sensitivity of the photodiode is increased. Additionally, breakdown voltage of the photodiode is increased, and a quantity of white pixels in a pixel array including the photodiode are reduced.

As described in greater detail above, some implementations described herein provide a method. The method includes forming, in a substrate, a photodiode for a pixel sensor of a pixel array. The method includes forming, in the substrate, a trench adjacent to the photodiode. The method includes forming a liner layer on sidewalls of the trench and on a bottom surface of the trench. The method includes forming a doping layer over the liner layer. The method includes driving zinc, gallium, or a combination thereof from the doping layer into the liner layer. The method includes removing the doping layer. The method includes filling the trench with a dielectric material over the liner layer to form a deep trench isolation (DTI) structure.

As described in greater detail above, some implementations described herein provide a method. The method includes forming, in a substrate, a photodiode for a pixel sensor of a pixel array. The method includes forming, in the substrate, a trench adjacent to the photodiode. The method includes forming a doping layer comprising zinc, gallium, or a combination thereof on sidewalls of the trench and on a bottom surface of the trench. The method includes forming a liner layer over the doping layer. The method includes filling the trench with a dielectric material over the liner layer to form a deep trench isolation (DTI) structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, in a substrate, a photodiode for a pixel sensor of a pixel array;

forming, in the substrate, a trench adjacent to the photo-diode;

conformally depositing a liner layer on sidewalls of the trench and on a bottom surface of the trench,
    wherein the liner layer comprises a metal oxide;

conformally depositing a doping layer on surfaces of the liner layer on the sidewalls of the trench and the bottom surface of the trench;

driving zinc, gallium, or a combination thereof from the doping layer into the liner layer;

removing the doping layer from the surfaces of the liner layer on the sidewalls of the trench and the bottom surface of the trench,
    wherein the doping layer is removed in a wet etching operation, and
    wherein the wet etching operation is performed with a mixture of ammonium hydroxide ($NH_4OH$), hydrogen peroxide ($H_2O_2$), and water ($H_2O$), or a mixture of hydrochloric acid (HCl), hydrogen peroxide ($H_2O_2$), and water ($H_2O$); and filling the trench with a dielectric material over the liner layer to form a deep trench isolation (DTI) structure.

2. The method of claim 1, wherein electron-hole bonds are located at an interface between the liner layer and the substrate.

3. The method of claim 1, wherein the doping layer comprises a zinc oxide, a gallium oxide, or a combination thereof.

4. The method of claim 1, wherein a thickness of the doping layer is in a range from approximately 5 Ångströms (Å) to approximately 15 Å.

5. The method of claim 1, further comprising:

forming, after removing the doping layer, an oxide layer on the surfaces of the liner layer on the sidewalls of the trench and the bottom surface of the trench,
    wherein the dielectric material is over the oxide layer in the DTI structure.

6. The method of claim 1, further comprising:

forming, after removing the doping layer, a high-κ layer on the surfaces of the liner layer on the sidewalls of the trench and the bottom surface of the trench,
    wherein the dielectric material is over the high-κ layer in the DTI structure.

7. The method of claim 1, wherein the zinc, the gallium, or the combination thereof is driven from the doping layer into the liner layer using a hydrogen plasma that is in a range from approximately 350 degrees Celsius to approximately 450 degrees Celsius.

8. A method, comprising:

forming a photodiode in a silicon substrate; and forming a deep trench isolation (DTI) structure, comprising a liner layer and a dielectric formed over the liner layer, in the silicon substrate, wherein forming the DTI structure comprises:

conformally depositing the liner layer on sidewalls of a trench and on a bottom surface of the trench,
    wherein the liner layer comprises a metal oxide;

conformally depositing a doping layer on surfaces of the liner layer on the sidewalls of the trench and the bottom surface of the trench;

performing an ion implantation operation to drive metal atoms from the doping layer into the liner layer;

removing the doping layer from the surfaces of the liner layer on the sidewalls of the trench and the bottom surface of the trench,
    wherein the doping layer is removed in a wet etching operation, and
    wherein the wet etching operation is performed with a mixture of ammonium hydroxide ($NH_4OH$), hydrogen peroxide ($H_2O_2$), and water ($H_2O$), or a mixture of hydrochloric acid (HCl), hydrogen peroxide ($H_2O_2$), and water ($H_2O$); and filling the trench with the dielectric, wherein the DTI structure is adjacent to the photodiode and electrically insulates the photodiode.

9. The method of claim 8, wherein the metal oxide is an aluminum oxide.

10. The method of claim 8, wherein a thickness of the liner layer is in a range from approximately 10 Ångströms (Å) to approximately 70 Å.

11. The method of claim 8, wherein the DTI structure further comprises an oxide layer between the liner layer and the dielectric.

12. The method of claim 8, wherein the DTI structure further comprises:

a high-κ layer between the liner layer and the dielectric.

13. The method of claim 12, wherein a thickness of the high-κ layer is in a range from approximately 400 Ångströms (Å) to approximately 600 Å.

14. The method of claim 8, wherein the ion implantation operation is performed using a hydrogen plasma that is in a range from approximately 350 degrees Celsius to approximately 450 degrees Celsius.

15. A method, comprising:

forming, in a substrate, a deep p-well region (DPW);

forming, in the substrate, a photodiode for a pixel sensor of a pixel array;

forming, in the substrate, a trench extending to the DPW;

lining sidewalls of the trench and a bottom surface of the trench with a liner layer,
    wherein the liner layer comprises a metal oxide;

conformally depositing a doping layer on surfaces of the liner layer on the sidewalls of the trench and the bottom surface of the trench;

driving zinc, gallium, or a combination thereof from the doping layer into the liner layer;

removing the doping layer from the surfaces of the liner layer on the sidewalls of the trench and the bottom surface of the trench,
    wherein the doping layer is removed in a wet etching operation, and
    wherein the wet etching operation is performed with a mixture of ammonium hydroxide ($NH_4OH$), hydrogen peroxide ($H_2O_2$), and water ($H_2O$), or a mixture of hydrochloric acid (HCl), hydrogen peroxide ($H_2O_2$), and water ($H_2O$); and filling the trench with a dielectric material over the liner layer to form a deep trench isolation (DTI) structure.

16. The method of claim 15, wherein the DPW and the photodiode are formed via a frontside of the substrate, and wherein the trench is formed via a backside of the substrate.

17. The method of claim 15, wherein the trench is formed after forming the photodiode.

18. The method of claim 15, wherein the zinc, the gallium, or the combination thereof is driven from the doping layer into the liner layer using a hydrogen plasma that is in a range from approximately 350 degrees Celsius to approximately 450 degrees Celsius.

19. The method of claim 15, further comprising:
forming, in the substrate, a drain region and a drain extension region.

20. The method of claim 15, further comprising:
forming, in the substrate, a gate dielectric layer.

* * * * *